(12) United States Patent
Lee et al.

(10) Patent No.: US 8,384,695 B2
(45) Date of Patent: Feb. 26, 2013

(54) AUTOMATIC IMPEDANCE ADJUSTER AND CONTROL METHOD THEREOF

(75) Inventors: Bang-Won Lee, Yongin-si (KR); Byung-Joon Moon, Yongin-si (KR); Jae-Surk Hong, Yongin-si (KR)

(73) Assignee: ATLAB Inc. (KR)

( * ) Notice: Subject to any disclaimer, the term of this patent is extended or adjusted under 35 U.S.C. 154(b) by 496 days.

(21) Appl. No.: 12/666,715

(22) PCT Filed: Apr. 2, 2008

(86) PCT No.: PCT/KR2008/001847
§ 371 (c)(1),
(2), (4) Date: Dec. 24, 2009

(87) PCT Pub. No.: WO2009/002007
PCT Pub. Date: Dec. 31, 2008

(65) Prior Publication Data
US 2010/0327953 A1   Dec. 30, 2010

(30) Foreign Application Priority Data
Jun. 28, 2007   (KR) .................. 10-2007-0064410

(51) Int. Cl.
*G06F 3/041* (2006.01)
(52) U.S. Cl. ........................................ 345/178
(58) Field of Classification Search ............ 345/178
See application file for complete search history.

(56) References Cited

U.S. PATENT DOCUMENTS

| 6,181,328 B1 | 1/2001 | Shieh et al. | |
| 6,417,838 B1* | 7/2002 | Inamura | 345/157 |
| 2006/0007181 A1* | 1/2006 | Jung et al. | 345/173 |
| 2007/0046950 A1* | 3/2007 | Brown et al. | 356/506 |
| 2010/0327953 A1* | 12/2010 | Lee et al. | 327/517 |

FOREIGN PATENT DOCUMENTS

| JP | 63-075919 | 4/1988 |
| JP | 03-244485 | 10/1991 |
| JP | 07-162280 | 6/1995 |
| JP | 09-238063 | 9/1997 |
| JP | 2007-013432 | 1/2007 |
| JP | 2007-208682 | 8/2007 |
| JP | 2007235286 | 9/2007 |
| JP | 2007-329866 | 12/2007 |
| KR | 10-2006-0101821 | 9/2006 |
| KR | 10-0719257 | 5/2007 |
| TW | 1272539 | 2/2007 |
| WO | 2006135152 | 12/2006 |

OTHER PUBLICATIONS

International Search Report for PCT/KR2008/001847 dated Aug. 5, 2008.
Written Opinion for PCT/KR2008/001847 dated Aug. 5, 2008.

(Continued)

*Primary Examiner* — Quan-Zhen Wang
*Assistant Examiner* — Nelson D Runkle, III
(74) *Attorney, Agent, or Firm* — Cantor Colburn LLP

(57) ABSTRACT

Provided are an automatic impedance adjuster and a control method thereof. The automatic impedance adjuster includes a specific channel for checking an operating environment. When an operation signal of the specific channel is detected or operation signals of all the channels are detected, the automatic impedance adjustment operation is performed to prevent malfunction of the impedance adjustment operation. In addition, malfunction of a touch sensor due to variation of the operating environment can be prevented to improve operating reliability of the touch sensor.

33 Claims, 13 Drawing Sheets

OTHER PUBLICATIONS

Japanese Office Action re: Japanese Patent Application No. 2010-513093 issued on Oct. 4, 2011, citing JP 7-162280, JP 9-238063, JP 2007-13432, JP 2007-208682, JP 2007-329866, and JP 63-75919.

International Preliminary Report on Patentability for PCT/KR2008/001847 dated Jan. 14, 2010.

Taiwanese Notice of Allowance—Taiwanese Application No. 097122576 issued on Aug. 21, 2012, citing WO2006-135152 and TW 1272539.

\* cited by examiner

AUTOMATIC IMPEDANCE ADJUSTER AND CONTROL METHOD THEREOF

TECHNICAL FIELD

The present invention relates to an automatic impedance adjuster and a control method thereof, and more particularly, to an automatic impedance adjuster and a control method thereof capable of automatically adjusting impedance of a sensor depending on variation of an external environment.

BACKGROUND ART

Among sensors are a touch sensor which detects in contact with an object by sensing an impedance change depending on whether the object is contact with a touch pad or not, and a capacitive sensor which detects a position of an object by sensing a capacitance change varied by a user's adjustment, etc.

Sensitivity of the touch sensor and the capacitive sensor may vary depending on variation of an external environment such as power voltage, ambient temperature, ambient humidity, etc, regardless of whether the object is in contact with the touch pad or there is user adjustment. If the sensitivity becomes low, the touch sensor and the capacitive sensor may not sense the impedance change or the capacitive change.

FIG. 1 is a block diagram showing a configuration of a conventional pulse-pass type touch sensor, which includes a pulse signal generating part 10, a plurality of channels CH1 to CH(N) and a controller 12. Among the pulse channels CH1 to CH(N), the channel CH1 includes a pulse signal transmission part 2 and a pulse signal detection part 3.

The configuration of the touch sensor shown in FIG. 1 will be described as follows.

A clock signal generator 13 of the pulse signal generating part 10 generates a clock signal CLK to transmit the clock signal CLK to a signal delay circuit 14 and an AND gate 16.

The signal delay circuit 14 varies a phase delay time of the clock signal CLK in response to a pulse width control signal PCON transmitted from the controller 12.

An inverter 15 inverts a clock signal DCLK output from the signal delay circuit 14.

The AND gate 16 performs an AND operation on the clock signal CLK transmitted from the clock signal generator 13 and the clock signal DCLK transmitted via the signal delay circuit 14 and the inverter 15 to generate a pulse signal having a pulse width corresponding to the phase delay time of the signal delay circuit 14.

The pulse signal transmission part 2 of the channel CH1 is connected to a touch pad 5 in contact with a touch object having a predetermined capacitance (hereinafter, referred to as a "touch object"). The pulse signal transmission part 2 receives a pulse signal of the pulse signal generating part 10. When the touch object is not in contact with the touch pad 5, the pulse signal is directly transmitted to the pulse signal detection part 3. When the touch object is in contact with the touch pad 5, a pulse signal phase-delayed by the capacitance is transmitted to the pulse signal detection part 3.

The pulse signal detection part 3 of the channel CH1 checks the pulse signal transmitted by the pulse signal transmission part 2 with the clock signal CLK to output a non-phase-delayed pulse signal and not to output a phase-delayed pulse signal.

The controller 12 receives output of the respective pulse signals P1 to P(N) of the channels CH1 to CH(N) to check the pulse signals P1 to P(N) of the channels and obtain the channels CH1 to CH(N) having no output of the pulse signals P1 to P(N).

The controller 12 generates an output signal OUT informing a touch of the touch object to the channels CH1 to CH(N), depending on the detection result of the pulse signals P1 to P(N), to output the output signal OUT to an external device (not shown), and then generates a pulse width control signal PCON to correct a pulse width of the pulse signal to be appropriate for the current operating environment.

At this time, the controller 12 determines that the touch object is not in contact with the touch pad when the pulse signal detection part 3 detects a high level signal, and determines that the touch object is in contact with the touch pad when the pulse signal detection part 3 detects a low level signal for a certain time or more.

Touch sensitivity of the touch pad 5 in the touch sensor is varied depending on an operating environment of the touch sensor such as operating power voltage, ambient temperature, ambient humidity, and so on. Therefore, the pulse signal as an output signal of the pulse signal transmission part 2 detected by the pulse signal detection part 3 has a phase delay varied depending on the operating environment.

FIG. 2 is a flowchart showing the operation of the conventional touch sensor.

The operation of the conventional touch sensor of FIG. 2 will now be described with reference to FIG. 1.

The pulse signal generating part 10 generates a pulse signal having a predetermined pulse width in response to a pulse width control signal PCON of the controller 12 to output the pulse signal to the pulse signal transmission part 2 (S1).

When the touch object is in contact with the touch pad 5, the pulse signal transmission part 2 outputs a phase-delayed pulse signal (S2). And when the touch object is not in contact with the touch pad 5, the pulse signal transmission part 2 transmits a non-pulse-delayed pulse signal to the pulse signal detection part 3 (S3).

The pulse signal detection part 3 does not output the phase-delayed pulse signal, and outputs the non-phase-delayed pulse signal only (S4).

As a result of step S4, when the pulse signal is not transmitted, the controller 12 determines that the touch object is in contact with the touch pad 5 and informs the determination to a user or an external device (S5). Then, the controller 12 resets "non-contact time" and returns to step S1 to perform a new touch detection operation (S6).

As a result of the determination of step S4, when the pulse signal is transmitted, the controller 12 determines that the touch object is not in contact with the touch pad 5 and informs the determination to the external device (S7), and determines whether an impedance adjustment period has arrived (S8).

As a result of the determination of step S8, when the impedance adjustment period has not arrived, the controller 12 increases the current "non-contact time" to a set value, and returns to step S1 to perform a new touch detection operation (S9).

As a result of the determination of step S8, when the impedance adjustment period has arrived, the controller 12 performs the impedance adjustment operation to correct the pulse width of the pulse signal to be appropriate for the current operating environment of the touch sensor (S10).

After correcting the pulse width through the impedance adjustment operation (S10), the controller 12 resets the current non-contact time, and then returns to step S1 to newly perform the touch detection operation using the pulse signal, the impedance of which was adjusted.

FIG. 3 is a flowchart showing the impedance adjustment operation of FIG. 2.

The controller 12 determines whether the non-contact accumulation time arrives at a non-contact determination time in order to determine whether conditions for performing the impedance adjustment operation of the pulse signal are satisfied (S1-1).

As a result of the determination of step S1-1, when the non-contact accumulation time is smaller than the non-contact determination time, the controller 12 determines that the impedance adjustment operation has performed under an abnormal condition and terminates the impedance adjustment operation.

As a result of the determination of step S1-1, when the non-contact accumulation time is equal to or larger than the non-contact determination time, the controller 12 determines that the touch pad is in a non-contact state for a certain time and that it is the impedance adjustment operation time, and holds the current output state to prevent malfunction of the external device by an output signal of the touch sensor generated during the impedance adjustment operation (S1-3).

The controller 12 sets the pulse width of the pulse signal as a maximum value (S1-4), and determines whether the pulse signal is transmitted through the pulse signal detection part 3 (S1-5).

As a result of the determination of step S1-5, when the pulse signal is transmitted, the pulse width of the pulse signal is reduced to a set value (S1-6), and after returning to step S1-5, the pulse width of the pulse signal is sequentially reduced until the pulse signal is not transmitted.

As a result of the determination of step S1-5, when the pulse signal is not transmitted, the controller 12 obtains the current pulse width as a critical pulse width (S1-7), and determines whether a difference between the current critical pulse width and the critical pulse width during the previous impedance adjustment is larger than an allowable value (S1-8).

At this time, the allowable value is a value which can be set by a user for determining whether the impedance adjustment operation of the pulse signal is normal or not.

When the difference between the current critical pulse width and the critical pulse width during the previous impedance adjustment is larger than the allowable value, the controller 12 determines that the impedance adjustment operation has performed under an abnormal condition (S1-2), and terminates the impedance adjustment operation.

When the difference between the current critical pulse width and the critical pulse width during the previous impedance adjustment is smaller than or equal to the allowable value, the controller 12 determines that the impedance adjustment operation has performed under a normal condition, and then adds a margin pulse width to the current critical pulse width to obtain an impedance-adjusted pulse width appropriate for the current operating environment (S1-9).

At this time, the margin pulse width is a value which can be set by a user for representing a touch sensitivity of the touch pad 5.

The impedance-adjusted pulse width is a minimum pulse width that the pulse signal detection part 3 can determine whether the pulse signal is transmitted under the current operating environment.

Then, the controller 12 corrects the pulse signal to the impedance-adjusted pulse width (S1-10), and then terminates the impedance adjustment operation.

FIG. 4 is a block diagram showing a configuration of a conventional delay-chain type touch sensor. The delay-chain type touch sensor includes a pulse signal generating part 40, a reference delay signal generating part 41, a plurality of channels CH1 to CH(N), and a controller 44. The channel CH1 among the channels CH1 to CH(N) includes a pulse signal transmission part 41-1, a variable delay part 42-1, and a pulse signal detection part 43-1.

The pulse signal generating part 40 generates a predetermined size of pulse signal as an output pulse signal R_Sig to apply it to the reference delay signal generating part 41 and the pulse signal transmission parts 41-1 to 41-N.

The reference delay signal generating part 41 delays the signal R_Sig by a predetermined time regardless of contact of the touch object, and generates a reference delay signal Sig1.

The pulse signal transmission parts 41-1 to 41-N include touch pads PAD in contact with the touch object. When the touch object is in contact with the touch pad PAD, the pulse signal R_Sig is delayed more than the reference delay signal Sig1, and when the touch object is not in contact with the touch pad PAD, the pulse signal R_Sig is delayed less than the reference delay signal Sig1 to generate touch signals Sig2-1 to Sig2-N such that the reference delay signal Sig1 is different from the delay time.

The variable delay parts 42-1 to 42-N vary the delay time of the touch signals Sig2-1 to Sig2-N in response to control signals D1 to Dn supplied from the controller 44, and output variable delay signals VSig2-1 to VSig2-N depending on the varied delay time.

The pulse signal detection parts 43-1 to 43-N are synchronized to the reference delay signal Sig1 to sample and latch the variable delay signals VSig2-1 to VSig2-N, thereby outputting touch signals S1 to S(N).

When the touch object is in contact with the touch pad PAD to continuously output the touch signals S1 to S(N), the controller 44 detects that the touch sensor is in operation, and receives the touch signals S1 to S(N) from the pulse signal transmission parts 41-1 to 41-N corresponding to the contacted pads PAD to generate touch outputs TOut-1 to TOut-N. When the touch object is not in contact with the touch pad PAD and not to output touch signals S1 to S(N), the controller 44 detects that the touch pad PAD is in standby, and controls the control signal D1 to Dn supplied to the variable delay parts 42-1 to 42-N to adjust the impedance of the touch pad PAD, thereby adjusting the delay time.

In order to prevent general operations of the touch sensor being affected by adjustment of the control signals D1 to Dn during the impedance adjustment operation using adjustment of the control signals D1 to Dn to the variable delay parts 42-1 to 42-N, the controller 44 holds the latest touch outputs TOut-1 to TOut-N of the touch pads PAD, and sequentially adjusts the control signals D1 to Dn with respect to the variable delay parts 42-1 to 42-N.

Then, the controller 44 varies the control signals D1 to Dn to repeatedly adjust the delay time of the variable delay parts 42-1 to 42-N and extracts a delay time when the touch signals S1 to S(N) have the same value as when the touch object is in contact with the touch pad PAD, i.e., a control value of the control signal, thereby obtaining minimum delay values D1(TH) to Dn(TH).

Next, the controller 44 calculates differences between the minimum delay values D1(TH) to Dn(TH) and the impedance of the touch pad PAD to determine a control value, and transmits the determined control value as the control signals D1 to Dn to the variable delay part to substantially obtain an error margin of the touch sensor.

That is, in order to generate correct touch outputs S1 to S(N) when the touch object is in contact with the touch pad PAD, considering the touch sensitivity of the touch pad PAD when the touch object is not in contact with the touch pad PAD, the controller 44 controls the variable delay part to output the variable delay signals VSig2-1 to VSig2-N such that delay times of the reference delay signal Sig1 and the variable delay signals VSig2-1 to VSig2-N are different from each other.

The initial impedance of the touch pad is obtained through repeated experiments. The larger the size of the touch pad, the larger the initial impedance of the touch pad.

FIG. 5 is a flowchart showing the operation of the touch sensor of FIG. 4.

The pulse signal generating part 40 generates a predetermined magnitude of pulse signal as an output pulse signal R_Sig to apply it to the reference delay signal generating part 41 and the pulse signal transmission parts 41-1 to 41-N (S5-1).

When the touch object is in contact with the touch pad PAD, the pulse signal transmission parts 41-1 to 41-N delay the pulse signal R_Sig more than the reference delay signal Sig1 to generate transmission signals Sig2-1 to Sig2-N delayed more than the reference delay signal Sig1 (S5-2), and when the touch object is not in contact with the touch pad PAD, transmission signals Sig2-1 to Sig2-N delayed less than the reference delay signal Sig1 are generated.

That is, when the touch object is not in contact with the touch pad PAD, the delay time of the variable delay parts 42-1 to 42-N is added to the transmission signals Sig2-1 to Sig2-N delayed less than the reference delay signal Sig1 output from the pulse signal transmission parts 41-1 to 41-N, and thus variable delay signals VSig2-1 to VSig2-N delayed to be equal to the reference delay signal Sig1 are generated.

The variable delay parts 42-1 to 42-N receive the transmission signals Sig2-1 to Sig2-N of the pulse signal transmission parts 41-1 to 41-N, respectively. When the touch object is in contact with the touch pad PAD, the delay time is added to output the variable delay signals VSig2-1 to VSig2-N delayed more than the reference delay signal Sig1, and when the touch object is not in contact with the touch pad PAD, the variable delay signals VSig2-1 to VSig2-N delayed equal to or less than the reference delay signal Sig1 are output.

At this time, since the touch object is not in contact with the touch pad PAD, it will be appreciated that the variable delay signals VSig2-1 to VSig2-N output from the variable delay parts 42-1 to 42-N can be delayed less than the reference delay signal Sig1.

The pulse signal detection parts 43-1 to 43-N receive the reference delay signal Sig1 and the variable delay signals VSig2-1 to VSig2-N to sample and latch the variable delay signals VSig2-1 to VSig2-N synchronized with the reference delay signal Sig1 to thereby output the touch signals S1 to S(N).

The controller 44 determines whether the touch signals S1 to S(N) are varied (S5-4). When the touch object is in contact with the touch pad PAD to continuously vary the touch signals S1 to S(N), the touch sensor detects the operation state, and receives the touch signals S1 to S(N) from the pulse signal transmission parts 41-1 to 41-N corresponding to the contacted pad PAD to generate touch outputs TOut-1 to TOut-N (S5-5). When the touch object is not in contact with the touch pad PAD not to vary the touch signals S1 to S(N) for a predetermined time, the controller 44 detects that the touch sensor is in standby (S5-6), and controls the control signals D1 to Dn supplied to the variable delay parts 42-1 to 42-N to perform the impedance adjustment of the touch pad PAD, thereby adjusting the delay time (S5-7).

FIG. 6 is a flowchart showing the impedance adjustment of FIG. 5.

In order to perform the touch sensitivity adjustment of the touch pad, the controller 44 holds current touch outputs to prevent adjustment of the delay time of the variable delay part from affecting general operations (S6-1).

The controller 44 initializes a variable i (S6-2). The variable i represents a sequence of the variable delay parts included in the touch channels CH1 to CH(N) to perform the delay time adjustment.

The controller 44 increases the variable i by 1 (S6-3), and sets a delay value of an i-th variable delay part to be a minimum value (S6-4). Then, the controller 44 checks whether a touch signal value is equal to the same value (Si=1) as when the touch object is in contact with the touch pad (S6-5), increases the delay value of the i-th variable delay part by the set value when the check result is false (S6-6), and repeats step S6-5. When the check result is true, the controller 44 obtains the minimum delay value Di(TH) at this time (S6-7).

The controller 44 calculates a difference between the minimum delay value Di(TH) of the i-th variable delay part obtained during the previous delay time adjustment and the minimum delay value Di(TH) of the i-th variable delay part obtained during the current delay time adjustment, and compares the difference with the minimum value of the delay time generated when the touch object is in contact with the touch pad having a minimum size to check whether the current delay time adjustment is performed in a normal condition (S6-8).

When the difference between the minimum delay values is smaller than the minimum value generated when the touch object is in contact with the touch pad having a minimum size, the controller 44 determines that the touch object is not in contact with the touch pad, and in an opposite case, the controller 44 determines that the touch object is in contact with the touch pad.

As a result of the check of step S6-8, when the delay time adjustment is performed in a normal condition, the controller 44 calculates a difference between the value obtained through step S6-7 and the impedance of the touch pad obtained by an experiment to obtain a control value of the i-th variable delay part, and transmits the obtained control value as a control signal Di for adjusting the delay time of the i-th variable delay part (S6-9).

When the delay time adjustment is performed in an abnormal condition, the controller 44 goes to a touch output release step (S6-11) to cancel the delay time adjustment of the variable delay part and stand by the next adjustment.

Then, the controller 44 checks whether the i value is larger than or equal to the number of the variable delay parts installed in the touch sensor (S6-10).

When the i value is different from the number of the variable delay parts, the controller 44 returns to step S6-3 to perform the delay time adjustment of the next variable delay part, and when the i value is equal to the number of the variable delay parts, the controller 44 terminates the delay time adjustment to release the held touch output such that a novel value is updated when the touch object is in contact with the touch pad (S6-11).

In the touch sensor using the impedance adjustment method, when power is applied by a user being in contact with the touch pad, the touch sensor recognizes the user-touched state as an initial state to adjust the impedance, thereby unfortunately decreasing the impedance.

In addition, in a totally different environment, for example, in a state where the touch pad is submerged under water, the touch pad maintains a touched state. Therefore, even though the user attempts to touch the touch pad, the touch pad cannot be operated. That is, the sensitivity of the touch pad is decreased.

DISCLOSURE

Technical Problem

In order to solve the foregoing and/or other problems, it is an aspect of the present invention to provide an automatic impedance adjuster capable of automatically adjusting an impedance of a sensor depending on variation of an operating environment, such as power voltage, ambient temperature, ambient humidity, abrasion of the sensor, and so on.

It is another aspect of the present invention to provide a method of entering an automatic impedance adjustment mode for automatically adjusting an impedance of a sensor depending on variation of an operating environment such as power voltage, ambient temperature, ambient humidity, abrasion of the sensor, and so on.

Technical Solution

One aspect of the present invention provides an automatic impedance adjuster including: a pulse signal generating part for generating a pulse signal having a pulse width varied in response to a pulse width control signal; a signal processing part including a plurality of channels having a plurality of first input sensors and a pulse width correction channel having a second input sensor, not outputting the pulse signal when a touch object is in contact with the first and second input sensors, and outputting the pulse signal when the touch object is not in contact with the first and second input sensors; and a controller for outputting a non-contact state when the pulse signal is detected and outputting a contact state when the pulse signal is not detected during a normal mode, entering an automatic impedance adjustment mode to control the pulse width control signal when a pre-determined time elapses, and entering the automatic impedance adjustment mode to control the pulse width control signal when the pulse signal is not detected through all the plurality of channels or the pulse width correction channel.

The controller may be a controller for outputting the non-contact state when the pulse signal is detected and outputting the contact state when the pulse signal is not detected during a normal mode, entering the automatic impedance adjustment mode to control the pulse width control signal when the pre-determined time elapses, and entering the automatic impedance adjustment mode to control the pulse width control signal when the pulse signal of the pulse width correction channel is not detected.

The controller may be a controller for entering the automatic impedance adjustment mode to control the pulse width control signal when the currently contacted channel is identical to the previously contacted channel for the pre-determined time during the normal mode.

The controller may be a controller for reducing the pre-determined time by a preset time when the currently contacted channel is identical to the previously contacted channel for the pre-determined time during the normal mode.

The controller may be a controller for, upon entering the automatic impedance adjustment mode, outputting the pulse width control signal to maximally adjust the pulse width of the pulse signal, and, during the operation of the automatic impedance adjustment mode, detecting output of the pulse signal of each channel output through the signal processing part, controlling the pulse width control signal until the pulse signal output is not detected, reducing the pulse width of the pulse signal by a preset value to obtain the pulse width of the pulse signal as a critical pulse width for each channel when the output of the pulse signal is not detected, and adding a set margin pulse width to the critical pulse width to obtain a correction pulse width to output as the pulse width control signal, to perform the impedance adjustment.

The channel may include: a pulse signal transmission part connected the first input sensor and the second input sensor, receiving the pulse signal, outputting a phase-delayed pulse signal when the touch object is in contact with the first input sensor and the second input sensor, and outputting the pulse signal when the touch object is not in contact with the first input sensor and the second input sensor; and a pulse signal detection part not outputting the pulse signal when the phase-delayed pulse signal is applied, and outputting the pulse signal when the non-phase-delayed pulse signal is applied.

Here, each of the first input sensor and the second input sensor may include a touch pad.

In addition, each of the first input sensor and the second input sensor may include a capacitive sensor including a lower electrode disposed at a lower side thereof and a movable upper electrode disposed at an upper side thereof and having a capacitance value between the lower and upper electrodes to output the capacitance value varied by moving the upper electrode by a user's adjustment.

Another aspect of the present invention provides an automatic impedance adjuster including: a pulse signal generating part for generating a pulse signal having a set pulse width; a delay signal generating part for outputting a delay signal that the pulse signal is delayed by a pre-determined time; a signal processing part including a plurality of channels having a plurality of first input sensors and a reference pulse channel having a second input sensor, outputting a phase-varied pulse signal when a touch object is in contact with the first and second input sensors and outputting a non-phase-varied pulse signal when the touch object is not in contact with the first and second input sensors in response to a delay value control signal; and a controller for outputting a non-contact state when the non-phase-varied pulse signal is detected and outputting a contact state when the phase-varied pulse signal is not detected during a normal mode, entering an automatic impedance adjustment mode to control the delay value control signal when a pre-determined time elapses, and entering the automatic impedance adjustment mode to control the delay value control signal when the phase-varied pulse signal is detected through all the plurality of channels or the reference pulse channel.

The controller may be a controller for outputting the non-contact state when the non-phase-varied pulse signal is detected and outputting the contact state when the phase-varied pulse signal is not detected during a normal mode, entering the automatic impedance adjustment mode to control the delay value control signal when the pre-determined time elapses, and entering the automatic impedance adjustment mode to control the delay value control signal when the phase-varied pulse signal is detected through the reference pulse channel.

The controller may be a controller for entering the automatic impedance adjustment mode to control the delay value control signal when the currently contacted channel is identical to the previously contacted channel for the pre-determined time during the normal mode.

The controller may be a controller for reducing the pre-determined time by a preset time when the currently contacted channel is identical to the previously contacted channel for the pre-determined during the normal mode.

The controller may be a controller for, upon entering the automatic impedance adjustment mode, outputting the delay value control signal, to minimally adjust the delay values of the variable delay parts of all the channels, and, during the operation of the automatic impedance adjustment mode, detecting output of the pulse signals of all the channels output through the signal processing part, increasing the delay values of the variable delay parts of all the channels by a preset value to obtain a minimum phase delay value the same as when the touch object is in contact with the input sensors of all the channels, and obtaining a difference between the minimum phase delay value and touch sensitivity of the input sensors to use the difference as the delay value control signal of each of the channels, to perform the impedance adjustment.

The controller may be a controller for, upon entering the automatic impedance adjustment mode, outputting the delay value control signal, to minimally adjust the delay values of the variable delay parts of the non-contacted channels, and, during the operation of the automatic impedance adjustment mode, detecting output of the pulse signals of the non-contacted channels output through the signal processing part, increasing the delay values of the variable delay parts of the non-contacted channels by a preset value to obtain a minimum phase delay value the same as when the touch object is in contact with the input sensors of the non-contacted channels, and obtaining a difference between the minimum phase delay value and touch sensitivity of the input sensors to use the difference as the delay value control signal of the non-contacted channels, to perform the impedance adjustment.

The channel may include: a pulse signal transmission part, to which the first input sensor and the second input sensor are connected, receiving the pulse signal, outputting the pulse signal phase-delayed more than the delay signal when the touch object is in contact with the first input sensor and the second input sensor, and outputting the pulse signal phase-delayed less than the delay signal when the touch object is not in contact with the first input sensor and the second input sensor; a variable delay part for receiving the pulse signal, and varying the delay time of the pulse signal to output a variable delay signal in response to the delay value control signal of the controller; and a pulse signal detection part for outputting the phase-varied pulse signal when the pulse signal phase-delayed more than the delay signal is applied, and outputting a non-pulse signal when the pulse signal phase-delayed equal to or less than the delay signal is applied.

Here, each of the first input sensor and the second input sensor may include a touch pad.

In addition, each of the first input sensor and the second input sensor may include a capacitive sensor including a lower electrode disposed at a lower side thereof and a movable upper electrode disposed at an upper side thereof and having a capacitance value between the lower and upper electrodes to output the capacitance value varied by moving the upper electrode by a user's adjustment.

Still another aspect of the present invention provides a method of controlling an automatic impedance adjuster including: a signal generating step of generating a pulse signal having a pre-determined pulse width; a signal processing step using a plurality of channels receiving the pulse signal and not outputting the pulse signal when a touch object is in contact with an input sensor to determine that the touch object is in contact with the input sensor, and outputting the pulse signal when the touch object is not in contact with the input sensor to determine that the touch object is not in contact with the input sensor; a control and output step of receiving the pulse signal to output whether the touch object is in contact with a channel, and entering an automatic impedance adjustment mode depending on the contact with the channel; and a automatic impedance adjustment step of performing the automatic impedance adjustment mode.

The signal processing step may include: a phase delay step of receiving the pulse signal, and delaying a phase of the pulse signal when the touch object is in contact with the input sensor and not delaying the phase of the pulse signal when the touch object is not in contact with the input sensor; and a pulse signal classification step of receiving the pulse signal of the phase delay step, and not outputting the pulse signal when the phase of the pulse signal is delayed and outputting the pulse signal when the phase of the pulse signal is not delayed.

The control and output step may include: a first correction entering step of receiving the pulse signal and determining whether a pulse signal of a pulse width correction channel is transmitted, determining whether the touch object is in contact with the input sensor of the pulse width correction channel when the pulse signal is not transmitted, and entering the automatic impedance adjustment mode for correcting the pulse width of all the channels; and a channel contact determination and signal output step of determining whether the pulse signals of all the channels except the pulse width correction channel are transmitted and entering the automatic impedance adjustment mode when the pulse signals are transmitted, and determining that the touch object is in contact with some of the channels to output the contact with the channels when the pulse signal is transmitted to some of the channels.

The channel contact determination and signal output step may include: a first channel contact determination step of determining whether the pulse signals of all the channels except the pulse width correction channel are transmitted when the pulse signals are transmitted to the pulse width correction channel of the first correction entering step; an impedance adjustment determination step of determining whether an impedance adjustment operation period has arrived when the pulse signals of all the channels except the pulse width correction channel are transmitted, and entering the automatic impedance adjustment mode or increasing a non-contact time to check the impedance adjustment operation period; and a second channel contact and signal output step of determining whether the pulse signals of some of the channels are transmitted when the pulse signals of all the channels except the pulse width correction channel are not transmitted, and entering the automatic impedance adjustment mode or outputting the contact with the channel to the exterior.

The impedance adjustment determination step may include: a correction period determination step of determining that the touch pads of all the channels are not in contact with the touch object when the pulse signals of all the channels except the pulse width correction channel are transmitted during the first channel contact determination step, and determining whether the impedance adjustment operation period has arrived; a second correction entering step of entering the automatic impedance adjustment mode for correcting the pulse width of all the channels when the impedance adjustment operation period of the correction period determination step has arrived; a non-contact time increasing step of increasing the non-contact time by a preset time and entering the signal generating step when the impedance adjustment operation period of the correction period determination step has not arrived; and a first non-contact time reset step of resetting the non-contact time and entering the signal generating step after performing the second correction entering step.

The second channel contact and signal output step may include: a partial channel contact determination step of determining whether the pulse signals of all the channels except the pulse width correction channel are not transmitted when the pulse signals of all the channels except the pulse width correction channel are not transmitted; a third correction entering step of determining that all the channels except the pulse width correction channel are in contact with the touch object when the pulse signals of all the channels except the pulse width correction channel of the partial channel contact determination step are not transmitted, and entering the automatic impedance adjustment mode for correcting the pulse width of all the channels; a contact or non-contact output step of determining that the input sensors of some of the channels are in contact with the touch object when only the pulse signals of some of the channels except the pulse width correction channel of the partial channel contact determination step are not transmitted, and outputting whether the channels are in contact with the touch object; and a second non-contact time reset step of resetting the non-contact time and entering the signal generating step after performing the contact or non-contact output step.

The contact or non-contact output step may further include: an output channel checking step of determining whether the previous contacted channel is identical to the current contacted channel, resetting a same channel contact time when the previous contacted channel is different from the current contacted channel and entering the second non-contact time reset step, and increasing the contact time of the same channels by a preset time when the previous contacted channel is identical to the current contacted channel; and the same channel correction step of determining whether the same channel contact time is larger than or equal to the same channel impedance adjustment time after increasing the same channel contact time by the preset time, entering the second non-contact time reset step when the same channel contact time is smaller than the same channel impedance adjustment time, entering the automatic impedance adjustment mode when the same channel contact time is larger than or equal to the same channel impedance adjustment time, and resetting the same channel contact time.

The contact or non-contact output step may further include: an output channel checking step of determining whether the previously contacted channel is identical to the currently contacted channel, resetting a same channel contact time when the previously contacted channel is different from the currently contacted channel and entering the second non-contact time reset step, and increasing the same channel contact time by a preset time when the previously contacted channel is identical to the currently contacted channel; and the same channel correction step of determining whether the same channel contact time is larger than or equal to the same channel impedance adjustment time after increasing the same channel contact time by the preset time, entering the second non-contact time reset step when the same channel contact time is smaller than the same channel impedance adjustment time, setting the non-contact determination time to be small in order to reduce a time to enter the automatic impedance adjustment mode when the same channel contact time is larger than or equal to the same channel impedance adjustment time, and resetting the same channel contact time.

Yet another aspect of the present invention provides a method of controlling an automatic impedance adjuster including: a signal generating step of generating a pulse signal having a predetermined pulse width; a signal processing step using a plurality of channels receiving the phase-varied pulse signal and outputting the pulse signal when a touch object is in contact with an input sensor to determine that the touch object is in contact with the input sensor, and outputting the non-phase-varied pulse signal when the touch object is not in contact with the input sensor to determine that the touch object is not in contact with the input sensor; a control and output step of receiving the pulse signal to output whether the touch object is in contact with a channel, and entering an automatic impedance adjustment mode depending on the contact with the channel; and a automatic impedance adjustment step of performing the automatic impedance adjustment mode.

The signal processing step may include: a reference delay step of receiving the pulse signal and delaying the pulse signal by a certain time to generate a reference delay signal; and a phase delay step of receiving the pulse signal to output the pulse signal phase-delayed more than the reference delay signal when a touch object is in contact with the input sensor, and outputting the pulse signal phase-delayed less than the reference delay signal when the touch object is not in contact with the input sensor.

The control and output step may include: a first correction entering step of receiving the pulse signal and determining whether the pulse signal of the reference pulse channel is identical to the previous pulse signal, determining that the touch object is in contact with the input sensor of the reference pulse channel when the pulse signal of the reference pulse channel is different from the previous pulse signal, and entering the automatic impedance adjustment mode for setting the delay values of all the channels; and a channel contact determination and signal output step of determining whether the pulse signals of all the channels, except the reference pulse channel, are identical to the previous pulse signal when the pulse signal of the reference pulse channel is identical to the previous pulse signal and entering the automatic impedance adjustment mode, and determining that the touch object is in contact with the input sensors of some of the channels when the pulse signals of some of the channels are identical to the previous pulse signal and outputting whether the touch object is in contact with channel.

The channel contact determination and signal output step may include: a first channel contact determination step of determining whether the pulse signals of all the channels, except the reference pulse channel, are identical to the previous pulse signal when the pulse signal of the reference pulse channel is identical to the previous pulse signal during the first correction entering step; an impedance adjustment determination step of determining whether the impedance adjustment operation period has arrived when the pulse signals of all the channels, except the reference pulse channel, are identical to the previous pulse signal, and entering the automatic impedance adjustment mode or increasing the non-contact time to check the impedance adjustment operation period; and a second channel contact and signal output step of determining that the pulse signals of some of the channels are different from the previous pulse signal when the pulse signals of all the channels, except the reference pulse channel, are different from the previous pulse signal, and entering the automatic impedance adjustment mode or outputting whether the touch object is in contact with the channel to the exterior.

The impedance adjustment determination step may include: a correction period determination step of determining that the input sensors of all the channels are not in contact with the touch object when the pulse signals of all the channels except the reference pulse channel are the same as the previous pulse signals during the first channel contact determination step, and determining whether the impedance adjustment operation period has arrived; a second correction entering step of entering the automatic impedance adjustment mode for setting delay values of all the channels when the impedance adjustment operation of the correction period determination step has arrived; a non-contact time increasing step of increasing the non-contact time by a preset time when the impedance adjustment operation of the correction period determination step has not arrived, and entering the signal generating step; and a first non-contact time reset step of resetting the non-contact time after performing the second correction entering step, and entering the signal generating step.

The second channel contact and signal output step may include: a partial channel contact determination step of determining whether the pulse signals of all the channels except the reference pulse channel are different from the previous pulse signal when the pulse signals of all the channels except the reference pulse channel are different from the previous pulse signals; a third correction entering step of determining that the input sensors of all the channels except the reference pulse channel are in contact with the touch object when the pulse signals of all the channels except the reference pulse channel of the partial channel contact determination step are different from the previous pulse signal, and entering the automatic impedance adjustment mode for setting the delay values of all the channels; a contact or non-contact output step of determining that the input sensors of some of the channels are in contact with the touch object when the pulse signals of some of the channels, except the reference pulse channel, of the partial channel contact determination step are different from the previous pulse signal, and outputting whether the contact channel is in contact with the touch object to the exterior; and a second non-contact time reset step of resetting the non-contact time after performing the contact or non-contact output step, and entering the signal generating step.

The contact or non-contact output step may further include: an output channel checking step of determining whether a currently contacted channel is identical to a previous contacted channel, resetting a same channel contact time when the previously contacted channel is different from the currently contacted channel and entering the second non-contact time reset step, and increasing the same channel contact time by a preset time when the previously contacted channel is identical to the currently contacted channel; and a same channel correction step of determining whether the same channel contact time is larger than or equal to a predetermined value of a same channel impedance adjustment time after increasing the same channel contact time by a preset time, entering the second non-contact time reset step when the same channel contact time is smaller than the same channel impedance adjustment time, entering the automatic impedance adjustment mode when the same channel contact time is larger than or equal to the same channel impedance adjustment time, and resetting the same channel contact time.

The contact or non-contact output step may further include: an output channel checking step of determining whether the previously contacted channel is identical to the currently contacted channel, resetting the same channel contact time when the previously contacted channel is different from the currently contacted channel and entering the second non-contact time reset step, and increasing the same channel contact time by a preset time when the previously contacted channel is identical to the currently contacted channel; and a correction time setting step of determining whether the same channel contact time is larger than or equal to the same channel impedance adjustment time after increasing the same channel contact time by the preset time, entering the second non-contact time reset step when the same channel contact time is smaller than the same channel impedance adjustment time, setting the non-contact time to be small in order to reduce a time to enter the automatic impedance adjustment mode when the same channel contact time is larger than or equal to the same channel impedance adjustment time, and resetting the same channel contact time.

Advantageous Effects

As can be seen from the foregoing, in order to solve a conventional problem of decreasing impedance of a touch pad due to an impedance adjustment operation in a state where some specific channels are in contact with a touch object and variation of an operating environment, an automatic impedance adjuster and a control method thereof in accordance with the present invention determines that the operating environment is varied when all the channels are in contact with the touch object to perform an automatic impedance adjustment operation, and has a specific channel to determine that the operating environment is varied when the specific channel is in contact with the touch object to perform the automatic impedance adjustment, thereby preventing malfunction of the impedance adjustment operation by dually checking the operating environment. In addition, when the specific channels are in contact with the touch object for a predetermined time or more, an automatic impedance adjustment operation period is reduced to rapidly deal with the operating environment, thereby preventing malfunction of a touch sensor due to variation of the operating environment and increasing operating reliability of the touch sensor.

MODES OF THE INVENTION

Figure 1:
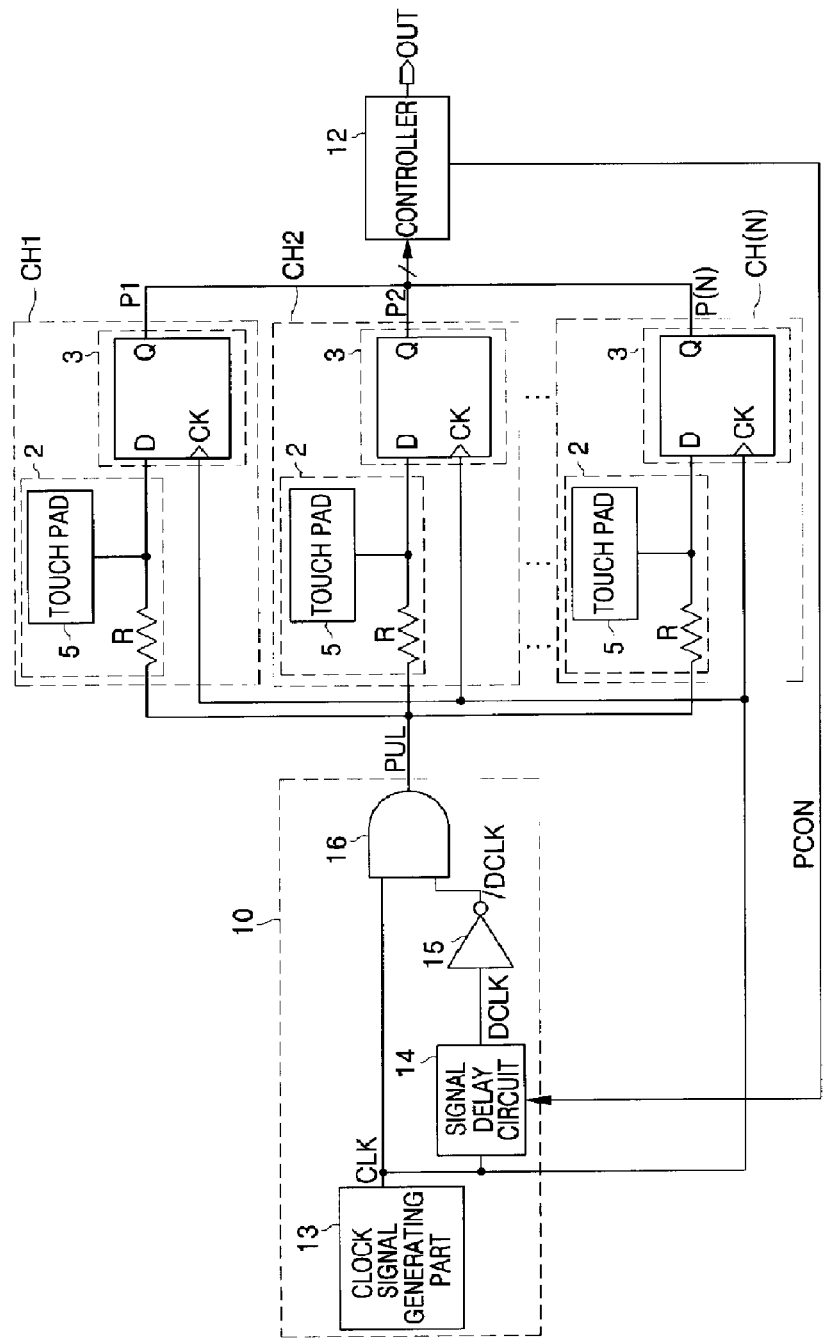
FIG. 1 is a block diagram showing a configuration of a conventional pulse-pass type touch sensor.
Figure 2:
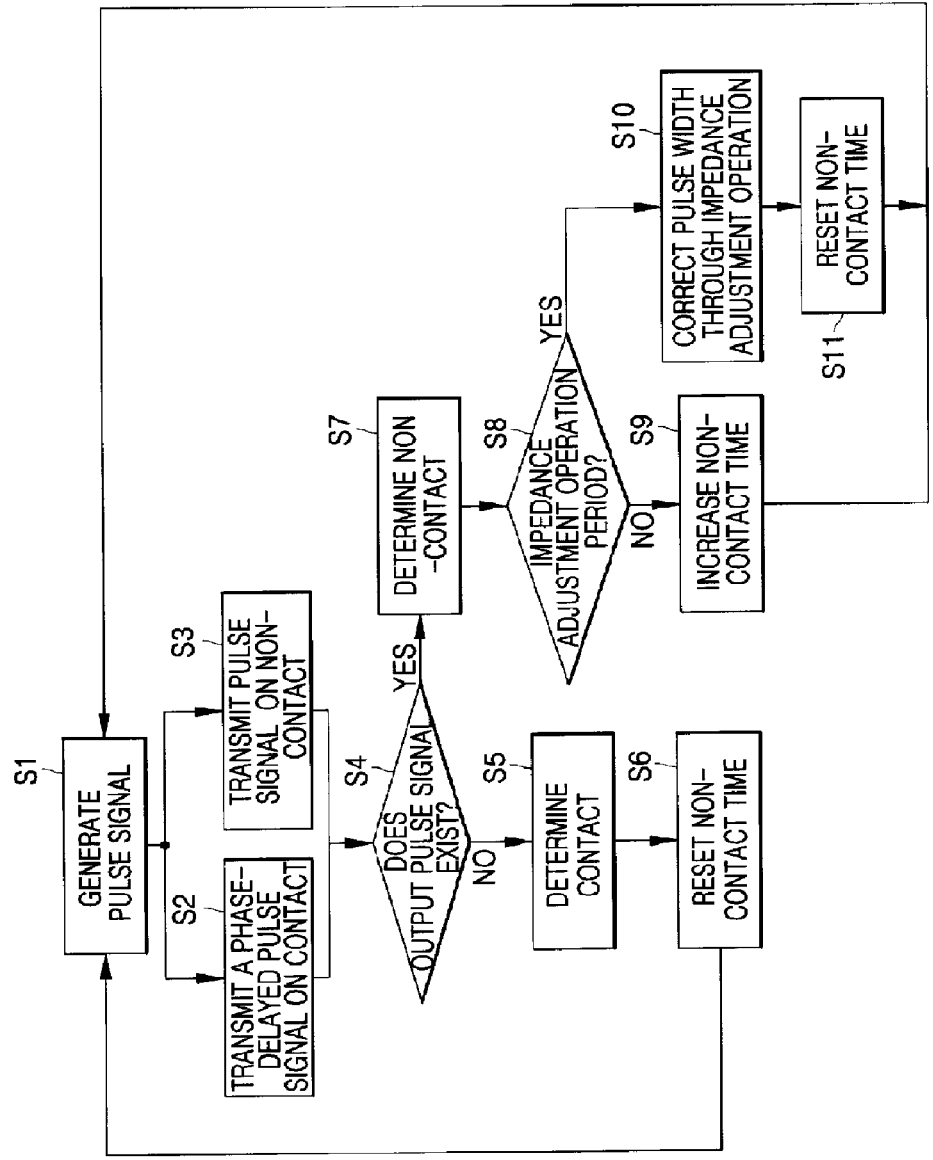
FIG. 2 is a flowchart showing the operation of the touch sensor of FIG. 1.

Exemplary embodiments of the present invention will now be described in detail with reference to the accompanying drawings, throughout which like reference numerals refer to like elements.

Figure 7:
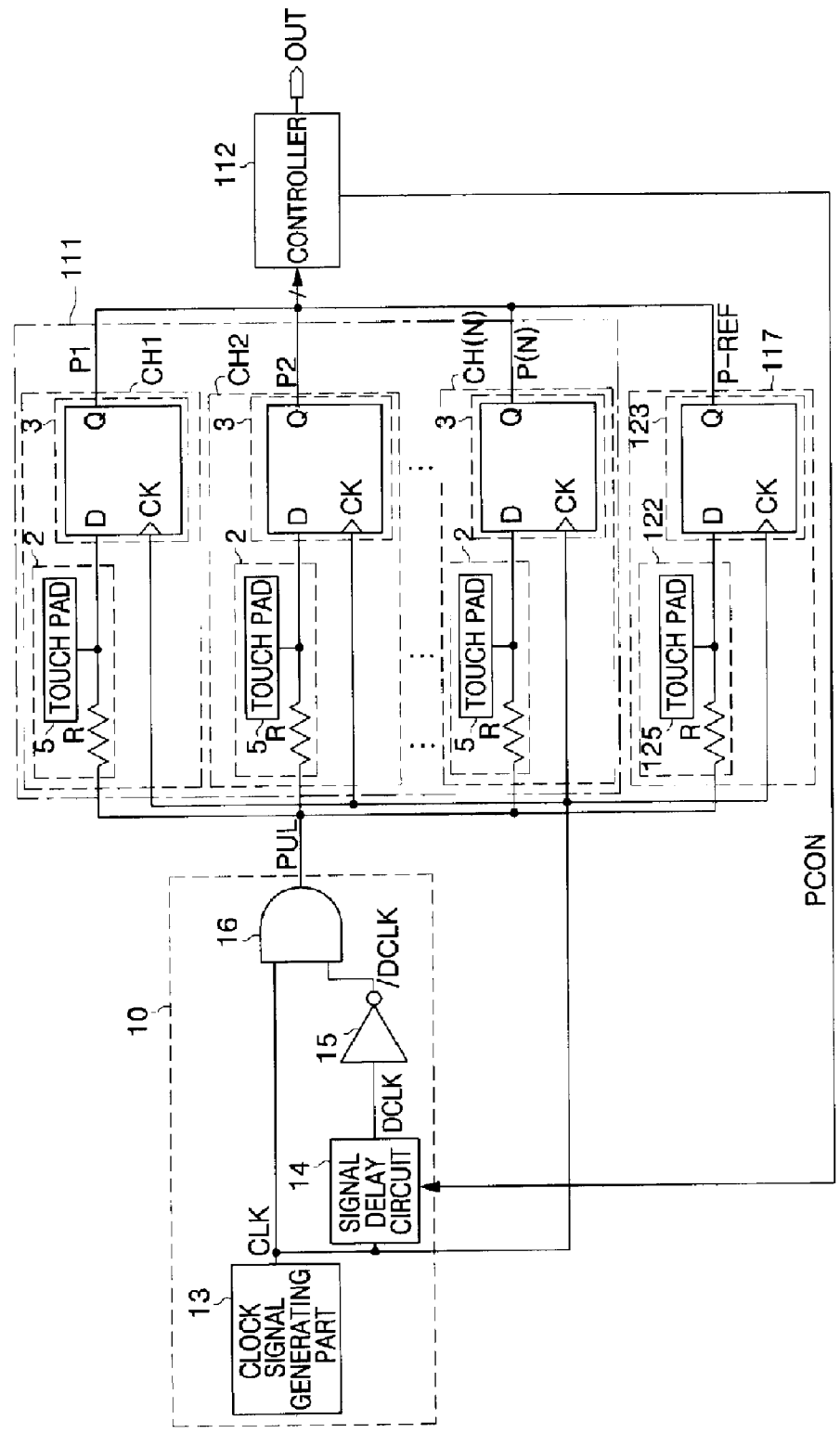
FIG. 7 is a block diagram showing a configuration of a pulse-path type touch sensor in accordance with an exemplary embodiment of the present invention.

FIG. 7 is a block diagram showing a configuration of a pulse-pass type touch sensor in accordance with an exemplary embodiment of the present invention, which includes a pulse signal generating part 10, a plurality of channels 111, a pulse width correction channel 117, and a controller 112. The channel CH1 of the channels 111 includes a pulse signal transmission part 2, and a pulse signal detection part 3.

The configuration of the touch sensor of FIG. 7 will be described as follows.

Here, the same reference numerals as in FIG. 1 designate the same components as described with reference to FIG. 1, and thus their description will not be repeated.

The pulse width correction channel 117 includes a correction signal transmission part 122, and a correction signal detection part 123. The correction signal transmission part 122 of the pulse width correction channel 117 is connected to a touch pad 125 in contact with a touch object having a predetermined capacitance. The correction signal transmission part 122 receives a pulse signal of the pulse signal generating part 10. When the touch object is not in contact with the touch pad 125, the pulse signal is directly transmitted to the correction signal detection part 123, and when the touch object is in contact with the touch pad 125, a phase-delayed pulse signal is transmitted to the correction signal detection part 123.

The correction signal detection part 123 of the pulse width correction channel 117 checks the pulse signal transmitted by the correction signal transmission part 122 to output a non-phase-delayed pulse signal P-REF and not to output the phase-delayed pulse signal.

The controller 112 receives pulse signal outputs P1 to P(N) of the channels 111 and a pulse signal output P-REF of the reference channel 117 and checks the pulse signals P1 to P(N) of the channels to obtain channels CH1 to CH(N) having no output of the pulse signals P1 to P(N), and checks the pulse signals P-REF of the pulse width correction channel 117 to determine whether the pulse signal P-REF is output.

The controller 112 generates an output signal OUT informing a touch of the touch object depending on detection result of the pulse signal to the channels 111 to output the output signal OUT to an external device (not shown). When the pulse signal P-REF of the pulse width correction channel 117 is not output depending on the detection result of the pulse width correction channel 117, the controller 112 determines that the operating environment is varied (for example, submerged under water) to perform an automatic impedance adjustment operation, and generates a pulse width control signal PCON to correct the pulse width of the pulse signal to be appropriate for the current operating environment.

At this time, when the pulse signal detection part 3 detects a high level signal, the controller 112 determines that the touch object is not in contact with the touch pad, and when the pulse signal detection part 3 detects a low level signal for a predetermined time or more, the controller 112 determines that the touch object is in contact with the touch pad.

Figure 8:
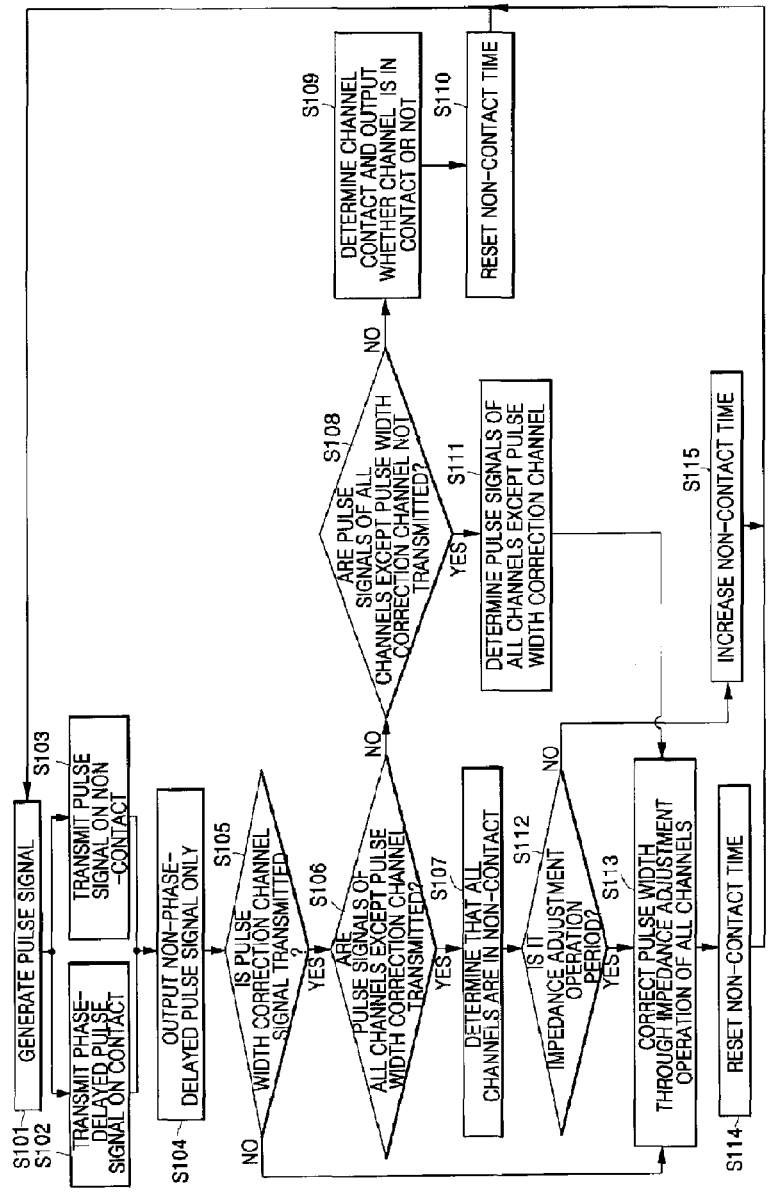
FIG. 8 is a flowchart showing an operation of the pulse-pass type touch sensor and a method of entering an automatic impedance adjustment mode.

FIG. 8 is a flowchart showing an operation of the pulse-pass type touch sensor and a method of entering an automatic impedance adjustment mode.

The description of FIG. 8 will be described using FIG. 7.

The pulse signal generating part 10 generates a pulse signal having a predetermined pulse width in response to the pulse width control signal PCON of the controller 112 to output it to the pulse signal transmission part 2 in the channels CH1 to CH(N) and the correction signal transmission part 122 in the pulse width correction channel 117 (S101).

When the touch object is in contact with the touch pads 5 and 125, the pulse signal transmission part 2 of the channels 111 and the correction signal transmission part 122 of the pulse width correction channel 117 output phase-delayed pulse signals (S102), and when the touch object is not in contact with the touch pads 5 and 125, the pulse signal transmission part 2 of the channels 111 and the correction signal transmission part 122 of the pulse width correction channel 117 output a non-phase-delayed pulse signal (S103).

The pulse signal detection part 3 of the channels 111 and the correction signal detection part 123 of the pulse width correction channel 117 output pulse signals P1 to P(N) and P-REF of the non-phase-delayed channels and do not output the pulse signals of the phase-delayed channels (S104).

The controller 112 receives output of the pulse signal P-REF of the pulse width correction channel 117, and determines whether the pulse signal P-REF of the pulse width correction channel 117 is transmitted (S105).

As a result of the determination of step S105, when the pulse signal P-REF of the pulse width correction channel 117 is not transmitted, the controller 112 determines that the touch object is in contact with the touch pad 125 to move to a step S113 and corrects a pulse width of the total channels through the impedance adjustment operation.

In addition, as a result of the determination of step S105, when the pulse signal P-REF of the pulse width correction channel 117 is transmitted, the controller 112 determines that the touch object is not in contact with the touch pad 125 to move to the next step.

The controller 112 receives outputs of the pulse signals P1 to P(N) of the channels 111, and determines whether the pulse signals P1 to P(N) of the channels 111 are transmitted (S106).

As a result of the determination of step S106, when the pulse signals P1 to P(N) of the channels 111 are not transmitted, the controller 112 moves to step S108, and when all the pulse signals P1 to P(N) of the channels 111 have been transmitted, the controller 112 determines that the touch object is not in contact with the touch pad 2 (S107).

Then, the controller 112 determines whether an impedance adjustment operation period has arrived (S112). When the impedance adjustment operation period has arrived, the controller 112 corrects the pulse width of all the channels 117 and CH1 to CH(N) through the impedance adjustment operation of all the channels 117 and CH1 to CH(N) (S113), resets a "non-contact time" (S114), and enters step S101 to perform a new touch detection operation. When the impedance adjustment operation period has not arrived, the controller 112 increases the "non-contact time" (S115), and enters step S101 to perform a new touch detection operation.

Next, when the pulse signals P1 to P(N) of all the channels CH1 to CH(N) except the pulse width correction channel 117 are not transmitted, the controller 112 determines whether the pulse signals P1 to P(N) of all the channels CH1 to CH(N) except the pulse width correction channel 117 are not transmitted (S108). When the pulse signals P1 to P(N) of all the channels CH1 to CH(N) except the pulse width correction channel 117 are not transmitted, the controller 112 determines that the touch object is in contact with all the channels CH1 to CH(N) except the pulse width correction channel 117 of the touch pad 2 (S111), and corrects the pulse width of all the channels 117 and CH1 to CH(N) through the impedance adjustment operation of all the channels 117 and CH1 to CH(N). When the pulse signal of several channels of all the channels CH1 to CH(N) except that the pulse width correction channel 117 are transmitted, the controller 112 determines that the touch object is in contact with the touch pad of the several channels to output the channel touch (S109), and resets a "non-contact time" (S110), and then enters step S101 to perform a new touch detection operation.

Figure 3:
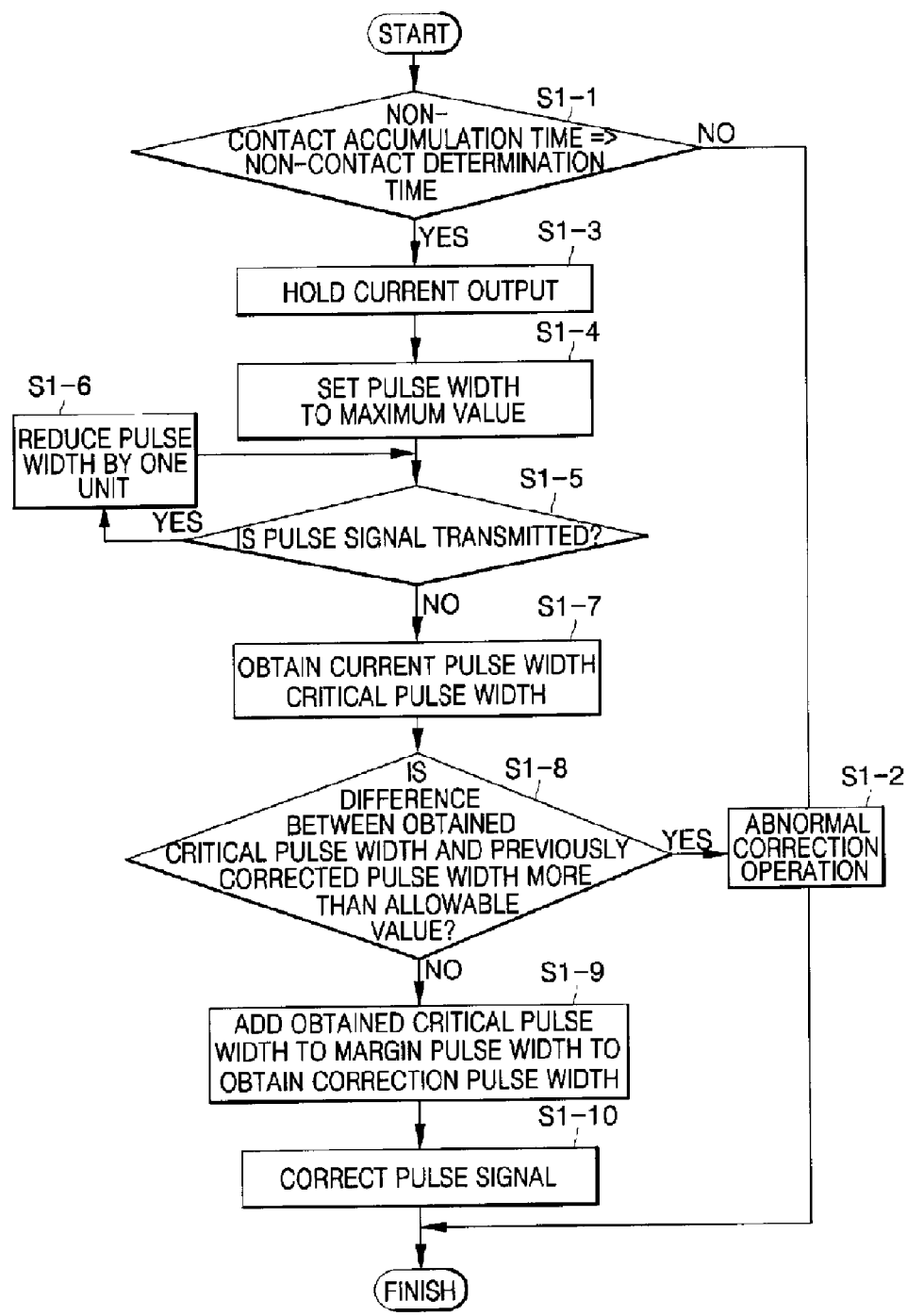
FIG. 3 is a flowchart showing an impedance adjustment operation of FIG. 2.

Here, the impedance adjustment operation is the same as FIG. 3, and thus its description will not be repeated.

As described above, the controller 112 separately prepares the pulse width correction channel for checking an operating environment, and determines whether the pulse signal P-REF of the pulse width correction channel 117 is not transferred. When the pulse signal P-REF of the pulse width correction channel 117 is not transferred, the controller 112 determines that the operating environment is changed and automatically adjusts impedance of all the channels 117 and CH1 to CH(N) to primarily prevent malfunction of all the channels 117 and CH1 to CH(N). In addition, the controller 112 determines whether the pulse signals P1 to P(N) of the channels CH1 to CH(N) are not transmitted depending on variation of the operating environment, and automatically adjusts the impedance of all the channels 117 and CH1 to CH(N) to secondarily prevent malfunction of all the channels 117 and CH1 to CH(N).

Figure 9:
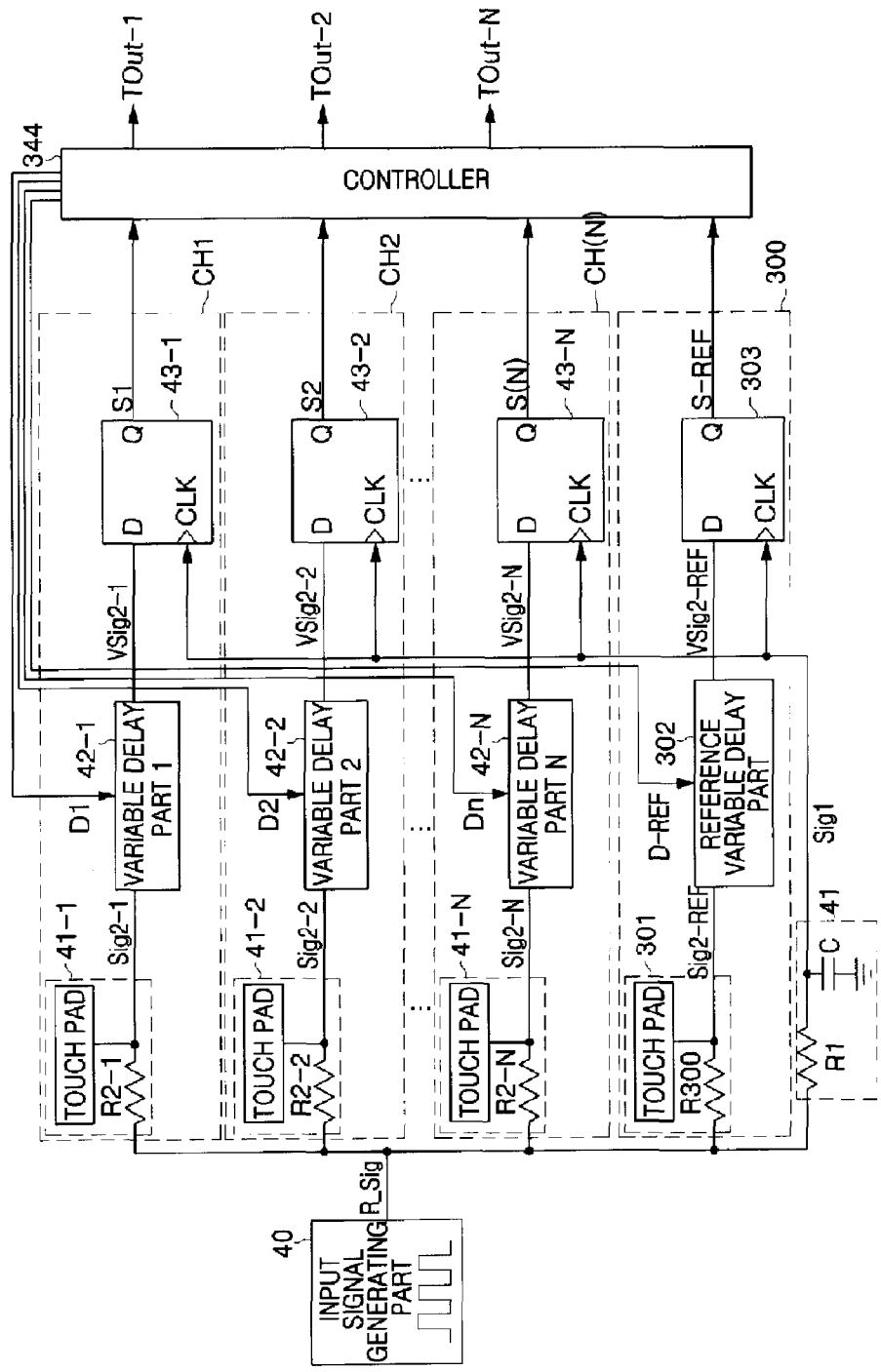
FIG. 9 is a block diagram showing a configuration of a delay-chain type touch sensor in accordance with an exemplary embodiment of the present invention.

FIG. 9 is a block diagram showing a configuration of a delay-chain type touch sensor in accordance with an exemplary embodiment of the present invention, which includes a pulse signal generating part 40, a reference delay signal generating part 41, a plurality of channels CH1 to CH(N), a reference pulse channel 300, and a controller 344. The channel CH1 among the channels CH1 to CH(N) includes a pulse signal transmission part 41-1, a variable delay part 42-1, and a pulse signal detection part 43-1.

Figure 4:
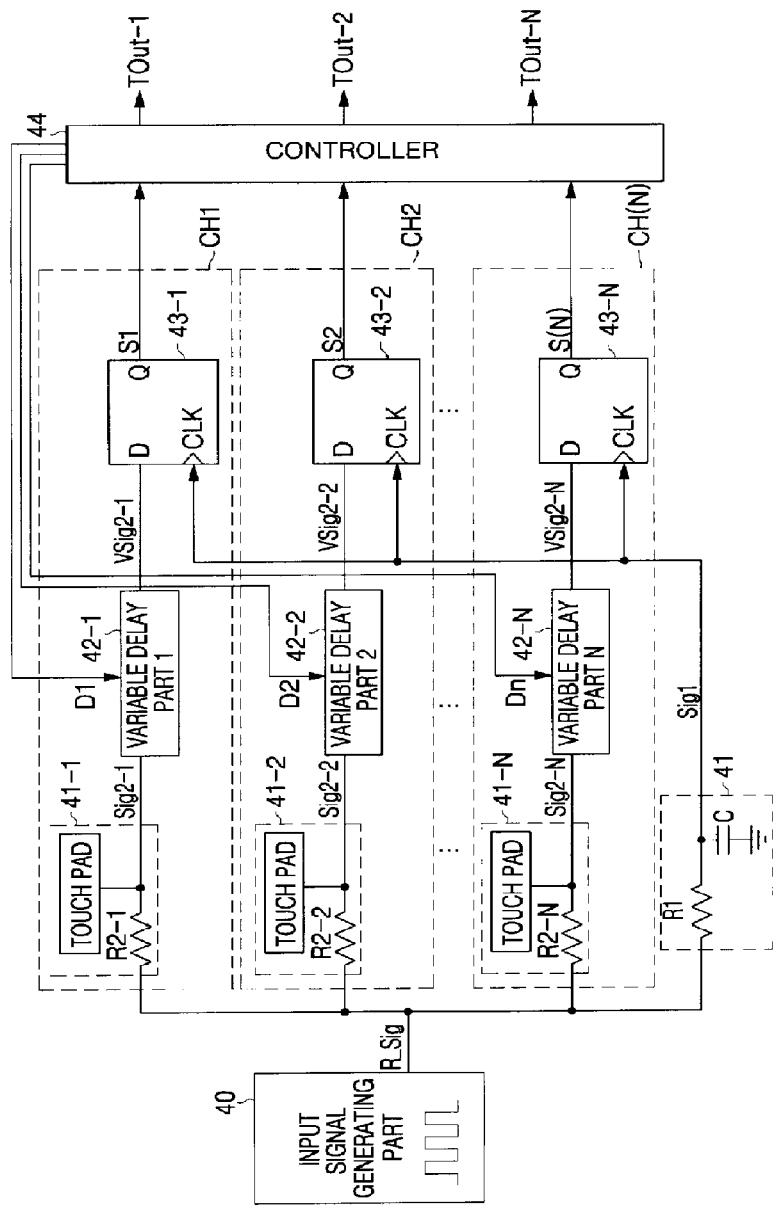
FIG. 4 is a block diagram showing a configuration of a conventional delay-chain type touch sensor.
Figure 5:
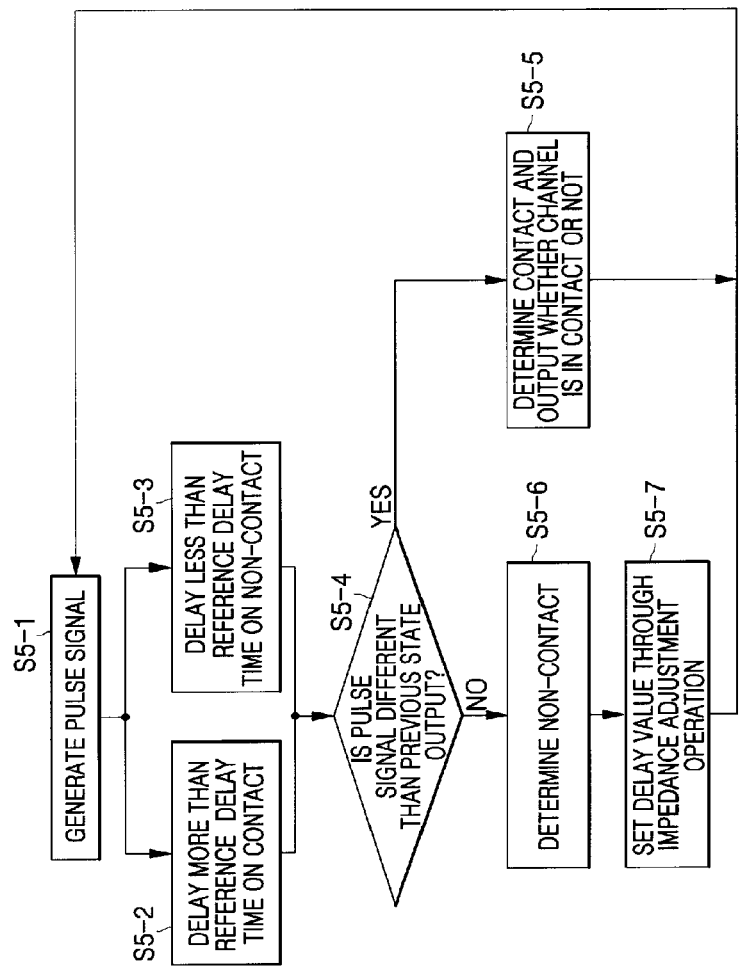
FIG. 5 is a flowchart showing the operation of the touch sensor of FIG. 4.

FIG. 9 will be described below with reference to FIG. 4.

Here, the same reference numerals as in FIG. 4 designate the same components as described with reference to FIG. 4, and thus their description will not be repeated.

The reference pulse channel 300 includes a pulse signal transmission part 301, a reference variable delay part 302, and a pulse signal detection part 303.

The pulse signal transmission part 301 includes a touch pad PAD to be in contact with a touch object. When the touch object is in contact with the touch pad PAD, the pulse signal transmission part 301 delays a pulse signal R_Sig more than a reference delay signal Sig1, and when not in contact with the touch pad PAD, delays the pulse signal R_Sig less than the reference delay signal Sig1 to generate a touch signal Sig2-REF to have a difference in delay time with respect to the reference delay signal Sig1.

The reference variable delay part 302 varies a delay time of the touch signal Sig2-REF in response to control signals D-REF supplied from the controller 344, and outputs variable delay signals VSig2-REF depending on the varied delay time.

The pulse signal detection part 303 is synchronized with the reference delay signal Sig1 to sample and latch the variable delay signal VSig2-REF to output a touch signal S-REF.

When the touch object is in contact with the touch pad PAD to continuously output touch signals S1 to S(N), the controller 344 detects that the touch sensor is in operation, and receives the touch signals S1 to S(N) from the pulse signal transmission parts 41-1 to 41-N corresponding to the contacted pads PAD to generate touch outputs TOut-1 to TOut-N. When the touch object is not in contact with the touch pad PAD, the controller 344 detects that the touch pad is in standby, and adjusts control signals D1 to Dn supplied to the variable delay parts 42-1 to 42-N and resets the delay value, thereby adjusting the impedance of the touch pad PAD.

The controller 344 determines whether the touch signal S-REF of the reference pulse channel 300 is different from the previous state. When the touch signal S-REF different from the previous state is output, the controller 344 determines that the touch pad PAD of the reference pulse channel 300 is in contact with the touch object, and resets the delay values of the reference variable delay part 302 of the reference pulse channel 300 and the variable delay parts 42-1 to 42-N of all the channels CH1 to CH(N) through the impedance adjustment operation of the reference pulse channel 300 and all the channels CH1 to CH(N) to adjust the impedance of the touch pad PAD.

In addition, the controller 344 determines whether the touch signals S1 to S(N) of all the channels CH1 to CH(N), except the reference pulse channel 300, are identical to the previous state. When the touch signals S1 to S(N) identical to the previous state are output, the controller 344 determines that the touch pads PAD of all the channels are not in contact with the touch object, and whether the impedance adjustment operation period has arrived. When the impedance adjustment operation period has arrived, the controller 344 resets the delay values of the reference variable delay part 302 of the reference pulse channel 300 and the variable delay parts 42-1 to 42-N of all the channels CH1 to Ch(N) through the impedance adjustment operation to adjust the impedance of the touch pads PAD.

In order to prevent adjustment of the control signals D1 to Dn and D-REF from affecting general operations of the touch sensor during the impedance adjustment operation, the controller 344 holds the latest touch outputs TOut-1 to TOut-N of the touch pads PAD, and sequentially adjusts the control signals D1 to Dn and D-REF with respect to the variable delay parts 42-1 to 42-N.

In addition, the controller 344 varies the control signals D1 to Dn and D-REF to repeatedly adjust the delay time of the variable delay parts 42-1 to 42-N and the reference variable delay part 302, and extracts the delay time when the values of the touch signals S1 to S(N) and S-REF are equal to the values generated when the touch pads PAD are in contact with the touch object, i.e., a control value of the control signal, thereby obtaining minimum delay values D1(TH) to Dn(TH) and D-REF(TH).

Then, the controller 344 calculates a difference between the minimum delay values D1(TH) to Dn(TH) and D-REF and the impedance of the touch pad PAD to determine a control value, and transmits the determined control value to the variable delay parts and the reference variable delay part as the control signals D1 to Dn and D-REF to sufficiently obtain an error margin.

That is, in order to generate correct touch outputs S1 to S(N) and S-REF when the touch object is in contact with the touch pad PAD, considering the touch sensitivity of the touch pad PAD when the touch object is not in contact with the touch pad PAD, the controller 344 controls the variable delay parts and the reference variable delay part 302 to output the variable delay signals VSig2-1 to VSig2-N and VSig2-REF such that delay times of the reference delay signal Sig1 and the variable delay signals VSig2-1 to VSig2-N and VSig2-REF are different from each other.

The initial impedance of the touch pad is obtained by repeated experiments. The larger the touch pad, the larger the initial impedance of the touch pad. For convenience of description, although it is described that the variable delay part does not exist behind the reference delay signal generating part 41, the variable delay part may be provided similar to other channels. The added variable delay part can be replaced with a resistor R1 and a capacitor C depending on necessity, and controlled by the controller 344.

Figure 10:
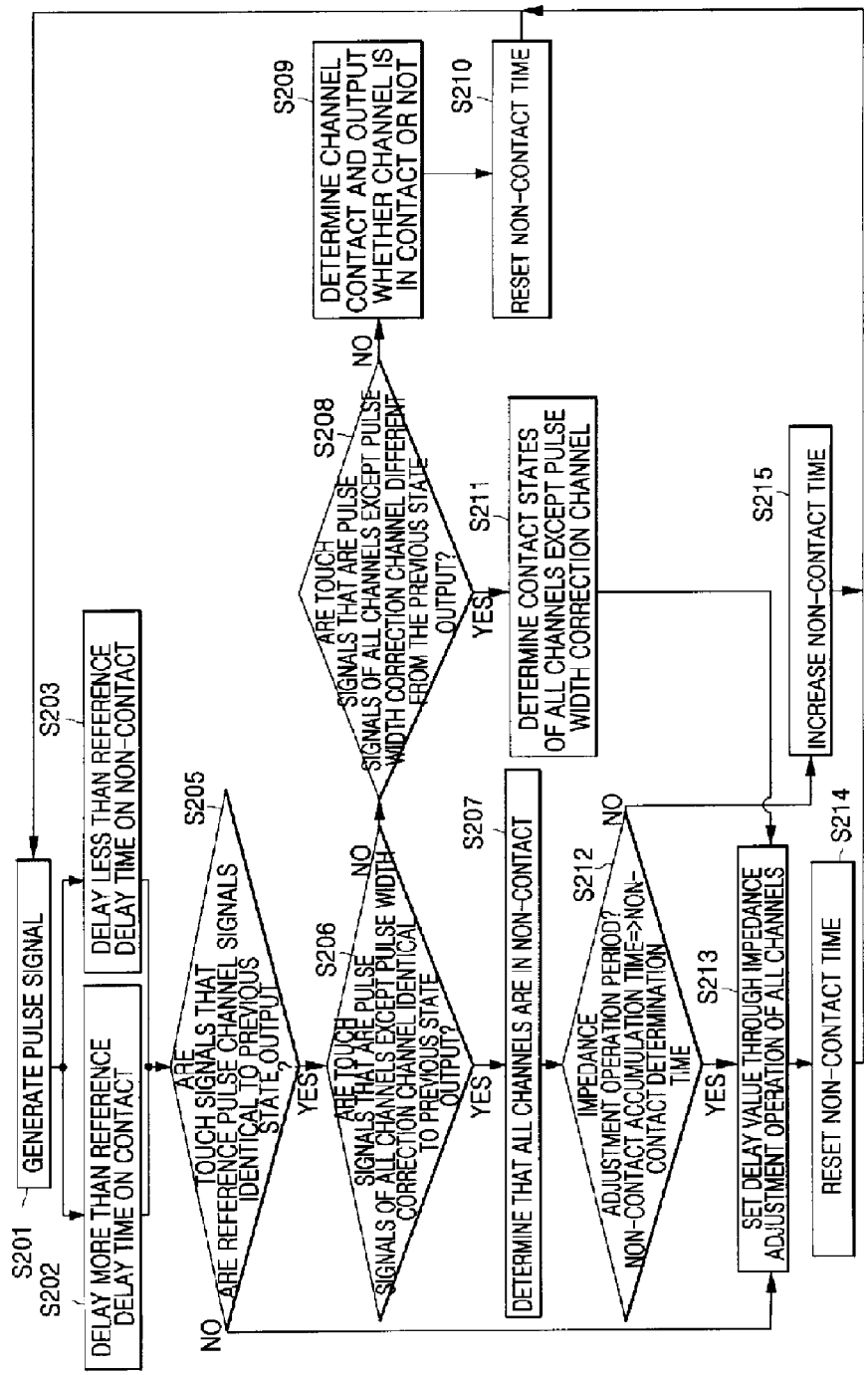
FIG. 10 is a flowchart showing an operation of the delay-chain type touch sensor and a method of entering an automatic impedance adjustment mode.

FIG. 10 is a flowchart showing an operation of the delay-chain type touch sensor and a method of entering an automatic impedance adjustment mode.

The operation of the touch sensor of FIG. 10 will be described below with reference to FIG. 9.

The pulse signal generating part 40 generates a predetermined magnitude of pulse signal as an output pulse signal R_Sig to apply it to the reference delay signal generating part 41 and the pulse signal transmission parts 41-1 to 41-N (S201).

When the touch object is in contact with the touch pad PAD, the pulse signal transmission parts 41-1 to 41-N delay the pulse signal R_Sig more than the reference delay signal Sig1 to generate transmission signals Sig2-1 to Sig2-N delayed more than the reference delay signal Sig1 (S202), and when the touch object is not in contact with the touch pad PAD, generate transmission signals Sig2-1 to Sig2-N delayed less than the reference delay signal Sig1 (S203).

That is, when the touch object is not in contact with the touch pad PAD, the delay time of the variable delay parts 42-1 to 42-N is added to the transmission signals Sig2-1 to Sig2-N delayed less than the reference delay signal Sig1 output from the pulse signal transmission parts 41-1 to 41-N to generate variable delay signals VSig2-1 to VSig2-N delayed equal to the reference delay signal Sig1.

The variable delay parts 42-1 to 42-N receive the transmission signals Sig2-1 to Sig2-N of the pulse signal transmission parts 41-1 to 41-N. When the touch object is in contact with the touch pad PAD, the delay time is added to output the variable delay signals VSig2-1 to VSig2-N delayed more than the reference delay signal Sig1, and when the touch object is not in contact with the touch pad PAD, the variable delay signals VSig2-1 to VSig2-N delayed equal to the reference delay signal Sig1 are output.

At this time, since the touch object is not in contact with the touch pad PAD, it will be appreciated that the variable delay signals VSig2-1 to VSig2-N output from the variable delay parts 42-1 to 42-N can be delayed less than the reference delay signal Sig1.

The pulse signal detection parts 43-1 to 43-N receive the reference delay signal Sig1 and the variable delay signals VSig2-1 to VSig2-N to sample and latch the variable delay signals VSig2-1 to VSig2-N synchronized with the reference delay signal Sig1 to thereby output the touch signals S1 to S(N).

The controller 344 determines whether the touch signal S-REF of the reference pulse channel 300 is different from the previous state (S205). As a result of the determination of step S205, when the touch signal S-REF that is different from the previous state is output, the controller 344 determines that the touch pad PAD of the reference pulse channel 300 is in contact with the touch object, and resets the delay values of the reference variable delay part 302 of the reference pulse channel 300 and the variable delay parts 42-1 to 42-N of all the channels CH1 to CH(N) through the impedance adjustment operation of the reference pulse channel 300 and all the channels CH1 to CH(N) to adjust the impedance of the touch pad PAD. As a result of the determination of step S205, when the touch signal S-REF identical to the previous state is output, the controller 344 determines that the touch pad PAD of the reference pulse channel 300 is not in contact with the touch object, and performs the next step S206.

Next, the controller 344 determines whether the touch signals S1 to S(N) of all the channels CH1 to CH(N), except the reference pulse channel 300, are different from the previous state (S206). As a result of the determination of step S206, when the touch signals S1 to S(N) identical to the previous state are output, the controller 344 determines that the touch pads PAD of all the channels CH1 to CH(N) are not in contact with the touch object (S207), and determines whether the non-contact accumulation time is larger than or equal to the non-contact determination time in order to determine whether the impedance adjustment operation period has arrived (S212).

As a result of the determination of step S212, when the non-contact accumulation time is larger than or equal to the non-contact determination time, the controller 344 resets the delay values of the variable delay parts through the impedance adjustment operation of the reference pulse channel 300 and all the channels CH1 to CH(N), and resets the "non-contact time" (S214).

As a result of the determination of step S212, when the non-contact accumulation time is smaller than the non-contact determination time, the controller 344 increases the "non-contact time" by a set value, and enters step S201 for receiving a new touch signal.

As a result of the determination of step S206, when the touch signals S1 to S(N) that are different from the previous state are output, step S208 is performed.

In step S208, the controller 344 determines whether the touch signals S1 to S(N) of all the channels CH1 to CH(N), except the reference pulse channel 300, that are different from the previous state are output. As a result of the determination of step S208, when the touch signals S1 to S(N) of all the channels CH1 to CH(N), except the reference pulse channel 300, that are different from the previous state are output, the controller determines that the touch pads PAD of all the channels CH1 to CH(N), except the reference pulse channel 300, are in contact with the touch object (S211), and resets the delay values of the reference variable delay part 302 of the reference pulse channel 300 and the variable delay parts 42-1 to 42-N of all the channels CH1 to CH(N) through the impedance adjustment operation of the reference pulse channel 300 and all the channels CH1 to CH(N) to adjust the impedance of the touch pad PAD.

As a result of the determination of step S208, when some of the touch signals S1 to S(N) of all the channels CH1 to CH(N), except the reference pulse channel 300, that are different from the previous state are output, the controller 344 determines that the touch pads PAD of some of the channels are in contact with the touch object to output contact of the channels to the exterior (S209), resets the "non-contact time" (S210), and enters step S201 for receiving a new touch signal.

Figure 6:
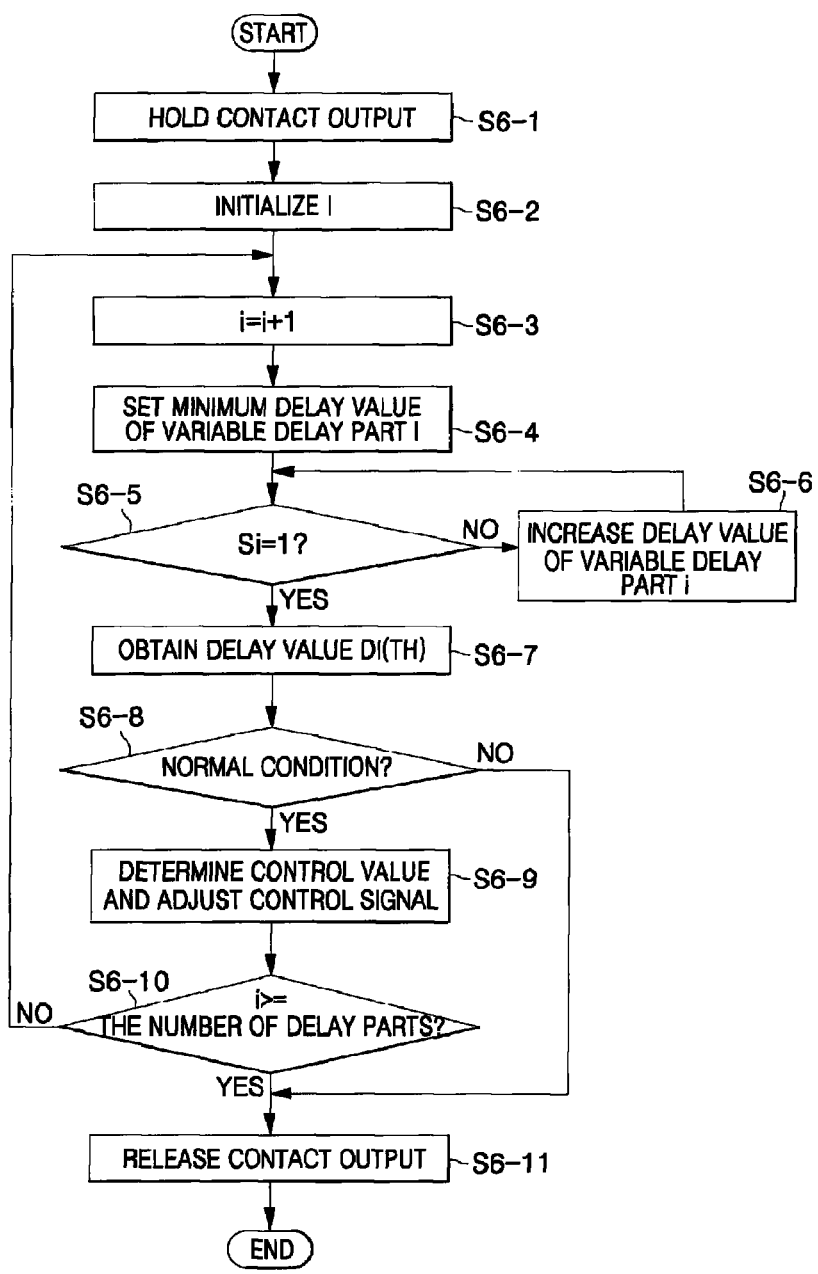
FIG. 6 is a flowchart showing an impedance adjustment operation of FIG. 5.

Here, the impedance adjustment operation is identical to FIG. 6, and thus its description will not be repeated.

As described above, the controller 344 separately prepares the reference pulse channel 300 for checking an operating environment, and determines whether the touch signal S-REF of the reference pulse channel 300 is different from the previous touch signal S-REF. When the pulse signal S-REF is different from the previous touch signal, the controller 344 determines that the operating environment is changed and automatically adjusts impedance of the channels CH1 to CH(N) to primarily prevent malfunction of the channels CH1 to CH(N). In addition, the controller 344 determines whether the pulse signals P1 to P(N) of the channels CH1 to CH(N) are different from the previous touch signals depending on variation of the operating environment. When they are different from each other, the controller automatically adjusts the impedance of the reference pulse channel and the channels CH1 to CH(N) to secondarily prevent malfunction of all the channels CH1 to CH(N).

Figure 11:
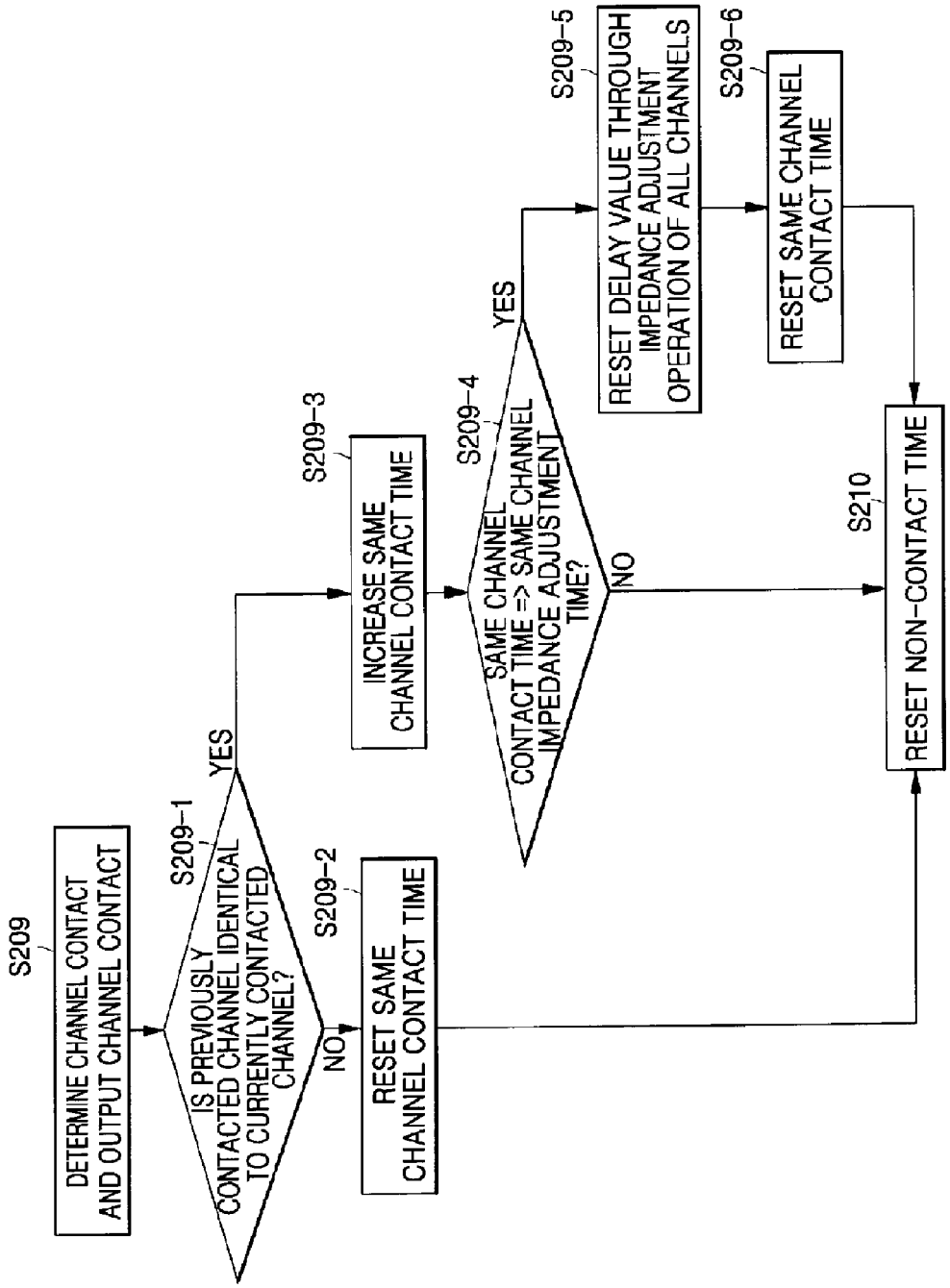
FIG. 11 is a flowchart showing a method of entering an automatic impedance adjustment mode in a state that a touch object is in contact with a portion of the touch pad of FIGS. 7 and 9 for a predetermined time or more.

FIG. 11 is a flowchart showing a method of entering an automatic impedance adjustment mode in a state that a touch object is in contact with a portion of the touch pad of FIGS. 7 and 9 for a predetermined time or more.

FIG. 11 will be described below with reference to FIGS. 8 and 10.

At this time, FIG. 8 is similar to FIG. 10, and the flowchart of FIG. 11 is added between steps S109 (S209) and S110 (S210) of FIGS. 8 and 10.

When the touch object is in contact with the touch pad PAD to determine the contacted channels, the pulse-pass type controller 112 or the delay-chain type controller 344 outputs the contacted channels to the exterior (S109 or S209), and determines whether the previously contacted channels are identical to the currently contacted channels (S209-1).

As a result of the determination of step S209-1, when the previously contacted channels are not identical to the currently contacted channel, the controller resets "the same channel contact time" (S209-2), resets the "non-contact time" (S110 or S210), and enters step S201 to receive a new touch signal.

As a result of the determination of step S209-1, when the previously contacted channels are identical to the currently contacted channel, the controller increases "the same channel contact time" by a set value (S209-3), and performs the next step S209-4.

Then, the controller determines whether "the same channel contact time" is larger than or equal to "the same channel impedance adjustment time" (S209-4).

Here, "the same channel impedance adjustment time" is a reference time which can be set by a user for performing the impedance adjustment operation of the touch pad PAD of the channel after the same channels are in contact with the touch object and a certain time elapses.

As a result of the determination of step S209-4, when "the same channel contact time" is smaller than "the same channel impedance adjustment time", the controller resets the "non-contact time" (S110 or S210), and enters step S201 to receive a new touch signal.

As a result of the determination of step S209-4, when "the same channel contact time" is larger than or equal to "the same channel impedance adjustment time", the controller performs the impedance adjustment operation of all the channels.

Next, the controller resets "the same channel contact time" (S209-6), resets the "non-contact time" (S110 or S210), and enters step S201 to receive a new touch signal.

Here, the impedance adjustment operation of FIG. 11 is the same as FIGS. 3 and 6, and thus its description will not be repeated.

In the method of entering an automatic impedance adjustment mode with a touch object being in contact with a portion of the touch pad, a method of performing the automatic impedance adjustment on entering the automatic impedance adjustment mode can selectively adjust the impedance of the non-contacted channels except the channels in contact with the touch pad PAD, not adjust the impedance of all the channels, or adjust the channels in contact with the touch pad PAD, thereby operating the touch sensor.

In addition, step S209-5 of FIG. 11 is a step of entering the automatic impedance adjustment mode. However, in a state where the touch object is in contact with a portion of the touch pad PAD for a predetermined time or more, in order to reduce a time to enter the automatic impedance adjustment mode without entering the automatic impedance adjustment mode, it is also possible to reduce an entering cycle of the automatic impedance adjustment mode by reducing the non-contact determination time than can be set by a user input or a program of main processor.

Figure 12:
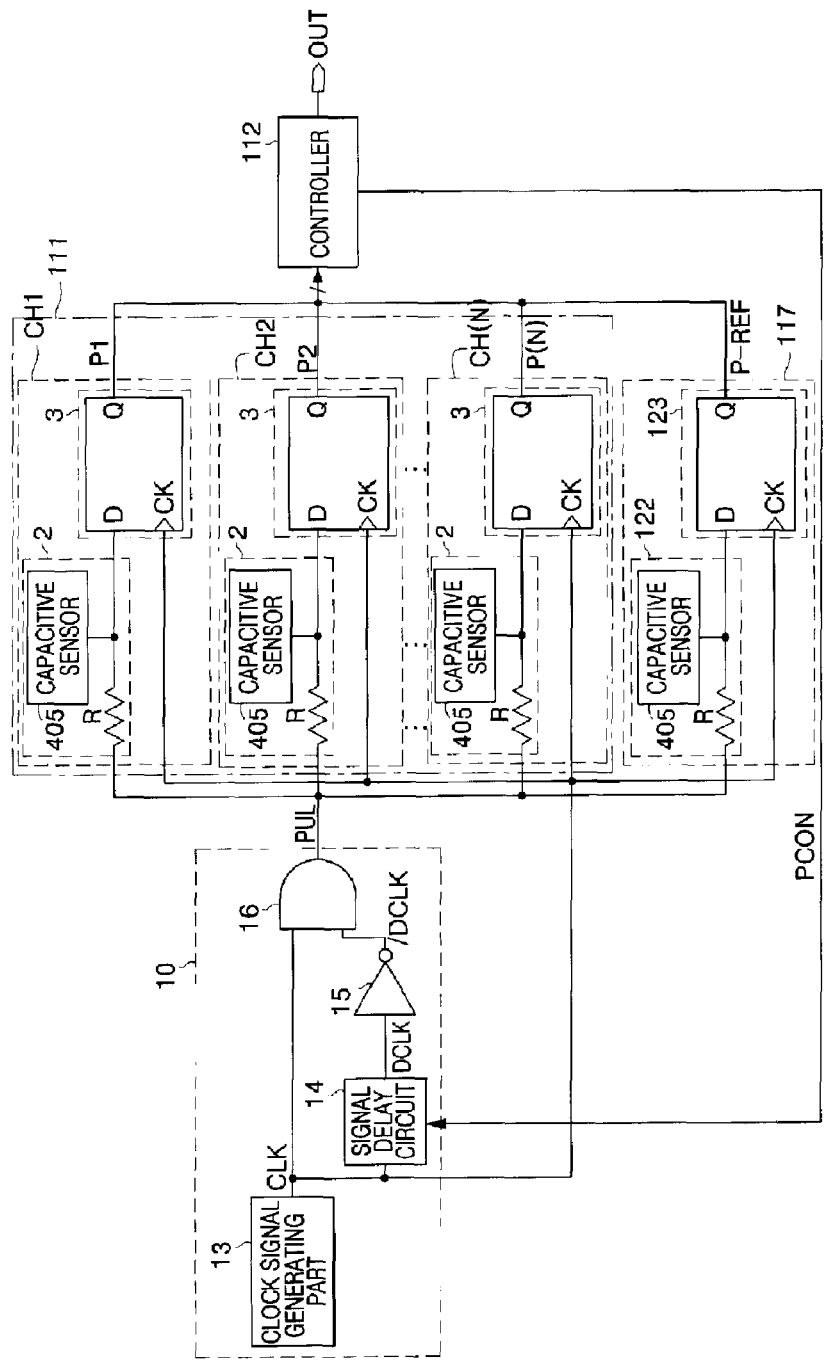
FIG. 12 is a block diagram showing a configuration of a touch sensor using a capacitive sensor in accordance with an exemplary embodiment of the present invention.

FIG. 12 is a block diagram showing a configuration of a touch sensor using a capacitive sensor in accordance with an exemplary embodiment of the present invention, which includes a pulse signal generating part 101, a plurality of channels CH1 to CH(N), and a controller 102.

The configuration of the capacitive sensor of FIG. 12 will be described below with reference to FIG. 7.

Here, the same reference numerals as in FIG. 7 designate the same components as described with reference to FIG. 7, and thus their description will not be repeated.

Capacitive sensors 405 in the channels CH1 to CH(N) have capacitance varied by a user's adjustment, and a phase delay of the pulse signal is generated depending on a magnitude of the capacitance.

Figure 13:
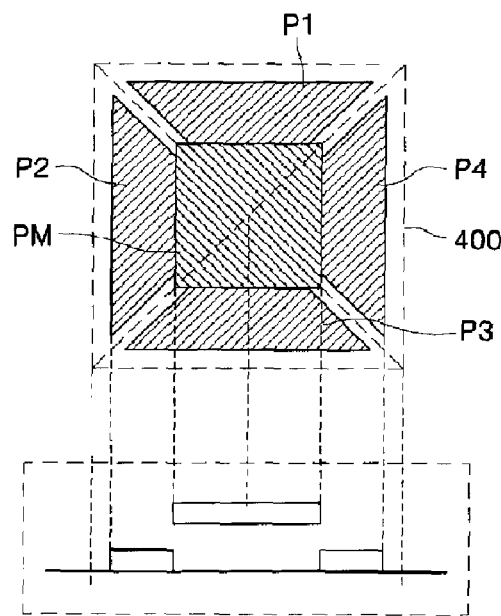
FIG. 13 is a diagram showing the structure of a capacitive sensor in a capacitive sensing part of FIG. 12 and a sensing method thereof.
Figure 13:
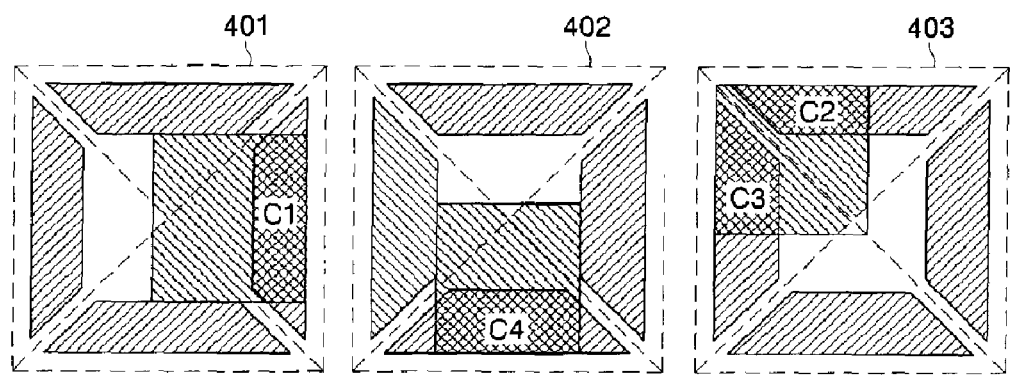

FIG. 13 is a diagram showing the structure of a capacitive sensor in a capacitive sensing part of FIG. 12 and a sensing method thereof.

The structure of the capacitive sensor and the sensing method of FIG. 13 will now be described.

The capacitive sensor 400 includes quarter-divided electrodes P1 to P4 disposed at its lower part, and a movable electrode PM disposed at its upper part, such that capacitance can exist between the upper and lower electrodes (an initial capacitance difference is 0). The upper electrode PM is connected to a handle (not shown), and the handle is connected to an elastic member (not shown). The upper handle is moved by a user's hand, and the handle connected to the elastic member is disposed at an intermediate position between the quarter-divided electrodes P1 to P4 when it is spaced apart from the user's hand.

In the sensing method of the capacitive sensor 400, when there is no adjustment by the user, the handle is disposed at an intermediate position between the quarter-divided electrodes P1 to P4, and a capacitance difference is 0.

In addition, when the handle is moved by adjustment of the user, the capacitance difference is generated (for example, 401, 402 and 403) to form a predetermined capacitance between the upper and lower electrodes.

While the capacitive sensor is adapted to the pulse-pass type touch sensor of FIG. 7, the capacitive sensor may also be adapted to the delay-chain type touch sensor of FIG. 9. Here, the capacitance value can be changed when moisture is injected into upper electrode or lower electrodes. The reference pulse channel 300 of FIG. 9 or the pulse width correction channel 117 of FIG. 12 is used to initiate the automatic impedance adjust mode.

As described above, the control method of an automatic impedance adjuster in accordance with the present invention can overcome a disadvantage of the conventional impedance adjuster, i.e., a phenomenon that the impedance is decreased when the touch object is in contact with only some specific touch pads or an operating environment is varied, by performing the automatic impedance adjustment operation when the touch object is in contact with all the touch pads of the channels or when the separate channel provided to check the operating environment is in contact with the touch object. In addition, when the time set by the user elapses in a state where the same touch pads maintain the contacted state for a predetermined time or more, the automatic impedance adjustment operation is performed to prevent the phenomenon or decreasing the impedance due to the contact with the same touch pads for a predetermined time or more.

While some exemplary embodiments of the present invention have been shown and described, it will be appreciated by those skilled in the art that various changes may be made to these embodiments without departing from the spirit and scope of the invention as defined by the appended claims and their equivalents.

The invention claimed is:

1. An automatic impedance adjuster comprising:
    a pulse signal generating part for generating a pulse signal having a pulse width varied in response to a pulse width control signal;
    a signal processing part including a plurality of channels having a plurality of first input sensors and a pulse width correction channel having a second input sensor, not outputting the pulse signal when a touch object is in contact with the first or second input sensor, and outputting the pulse signal when the touch object is not in contact with the first or second input sensor, the pulse width correction channel initiating an automatic impedance adjustment mode when the pulse signal is not detected therefrom; and
    a controller for outputting a non-contact state when the pulse signal is detected and outputting a contact state when the pulse signal is not detected during a normal mode, entering the automatic impedance adjustment mode to control the pulse width control signal when a pre-determined time elapses, and entering the automatic impedance adjustment mode to control the pulse width control signal when the pulse signal is not detected through all the plurality of channels or the pulse width correction channel.

2. The automatic impedance adjuster according to claim 1, wherein the controller outputting the non-contact state when the pulse signal is detected and outputting the contact state when the pulse signal is not detected during the normal mode, entering the automatic impedance adjustment mode to control the pulse width control signal when the pre-determined time elapses, and entering the automatic impedance adjustment mode to control the pulse width control signal when the pulse signal of the pulse width correction channel is not detected.

3. The automatic impedance adjuster according to claim 1, wherein the controller enters the automatic impedance adjustment mode to control the pulse width control signal when currently contacted channel is identical to previously contacted channel for the pre-determined time during the normal mode.

4. The automatic impedance adjuster according to claim 1, wherein the controller reduces the pre-determined time by a preset time when a currently contacted channel is identical to a previously contacted channel for the pre-determined time during the normal mode.

5. The automatic impedance adjuster according to claim 1, wherein the controller, upon entering the automatic impedance adjustment mode, outputs the pulse width control signal to maximally adjust the pulse width of the pulse signal, and, during the operation of the automatic impedance adjustment mode, detects output of the pulse signal of each channel output through the signal processing part, controls the pulse width control signal until the pulse signal output is not detected, reduces the pulse width of the pulse signal by a preset value to obtain the pulse width of the pulse signal as a critical pulse width for each channel when the output of the pulse signal is not detected, and adds a pre-determined margin pulse width to the critical pulse width to obtain a correction pulse width to output as the pulse width control signal, to perform the impedance adjustment.

6. The automatic impedance adjuster according to claim 1, wherein each of the plurality of channels comprises:
    a pulse signal transmission part connected to the first input sensor, receiving the pulse signal, outputting a phase-delayed pulse signal when the touch object is in contact with the first input sensor, and outputting the pulse signal when the touch object is not in contact with the first input sensor; and
    a pulse signal detection part not outputting the pulse signal when the phase-delayed pulse signal is applied, and outputting the pulse signal when the non-phase-delayed pulse signal is applied.

7. The automatic impedance adjuster according to claim 1, wherein each of the first input sensor and the second input sensor comprises a touch pad.

8. The automatic impedance adjuster according to claim 1, wherein each of the first input sensor and the second input sensor comprises a capacitive sensor including a lower electrode disposed at a lower side thereof and a movable upper electrode disposed at an upper side thereof and having a capacitance value between the lower and upper electrodes to output the capacitance value varied by moving the upper electrode by a user's adjustment.

9. An automatic impedance adjuster comprising:
    a pulse signal generating part for generating a pulse signal having a pre-determined pulse width;
    a delay signal generating part for outputting a delay signal that the pulse signal is delayed by a pre-determined time;
    a signal processing part including a plurality of channels having a plurality of first input sensors and a reference pulse channel having a second input sensor, outputting a phase-varied pulse signal when a touch object is in contact with the first or second input sensor and outputting a non-phase-varied pulse signal when the touch object is not in contact with the first or second input sensors in response to a delay value control signal, the reference pulse channel initiating an automatic impedance adjustment mode when the phase-varied pulse signal is not detected therefrom; and
    a controller for outputting a non-contact state when the non-phase-varied pulse signal is detected and outputting a contact state when the phase-varied pulse signal is not detected during a normal mode, entering the automatic impedance adjustment mode to control the delay value control signal when a pre-determined time elapses, and entering the automatic impedance adjustment mode to control the delay value control signal when the phase-varied pulse signal is detected through all the plurality of channels or the reference pulse channel.

10. The automatic impedance adjuster according to claim 9, wherein the controller outputs the non-contact state when the non-phase-varied pulse signal is detected and outputs the contact state when the phase-varied pulse signal is not detected during the normal mode, enters the automatic impedance adjustment mode to control the delay value control signal when the pre-determined time elapses, and enters the automatic impedance adjustment mode to control the delay value control signal when the phase-varied pulse signal is detected through the reference pulse channel.

11. The automatic impedance adjuster according to claim 9, wherein the controller enters the automatic impedance adjustment mode to control the delay value control signal when a currently contacted channel is identical to a previously contacted channel for the pre-determined time during the normal mode.

12. The automatic impedance adjuster according to claim 9, wherein the controller reduces the pre-determined time by a preset time when a currently contacted channel is identical to a previously contacted channel for the pre-determined time during the normal mode.

13. The automatic impedance adjuster according to claim 9, wherein the controller, upon entering the automatic impedance adjustment mode, outputs the delay value control signal, to minimally adjust delay values of variable delay parts of all the plurality of channels, and, during the operation of the automatic impedance adjustment mode, detects output of the pulse signals of all the plurality of channels output through the signal processing part, increases the delay values of the variable delay parts of all the plurality of channels by a preset value to obtain a minimum phase delay value the same as when the touch object is in contact with the first input sensors of all the plurality of channels, and obtains a difference between the minimum phase delay value and touch sensitivity of the first input sensors to use the difference as the delay value control signal of each of the plurality of channels, to perform the impedance adjustment.

14. The automatic impedance adjuster according to claim 9, wherein the controller, upon entering the automatic impedance adjustment mode, outputs the delay value control signal, to minimally adjust delay values of variable delay parts of non-contacted channels, and, during the operation of the automatic impedance adjustment mode, detects output of the pulse signals of the non-contacted channels output through the signal processing part, increases the delay values of the variable delay parts of the non-contacted channels by a preset value to obtain a minimum phase delay value the same as when the touch object is in contact with input sensors of the non-contacted channels, and obtains a difference between the minimum phase delay value and touch sensitivity of the input sensors of the non-contacted channels to use the difference as the delay value control signal of the non-contacted channels, to perform the impedance adjustment.

15. The automatic impedance adjuster according to claim 9, wherein each the plurality of channels comprises:
  a pulse signal transmission part, to which the first input sensor is connected, receiving the pulse signal, outputting the pulse signal phase-delayed more than the delay signal when the touch object is in contact with the first input sensor, and outputting the pulse signal phase-delayed less than the delay signal when the touch object is not in contact with the first input sensor;
  a variable delay part for receiving the pulse signal, and varying the delay time of the pulse signal to output a variable delay signal in response to the delay value control signal of the controller; and
  a pulse signal detection part for outputting the phase-varied pulse signal when the pulse signal of phase-delayed more than the delay signal is applied, and outputting a non-pulse signal when the pulse signal phase-delayed equal to or less than the delay signal is applied.

16. The automatic impedance adjuster according to claim 9, wherein each of the first input sensor and the second input sensor comprises a touch pad.

17. The automatic impedance adjuster according to claim 9, wherein each of the first input sensor and the second input sensor comprises a capacitive sensor including a lower electrode disposed at a lower side thereof and a movable upper electrode disposed at an upper side thereof and having a capacitance value between the lower and upper electrodes to output the capacitance value varied by moving the upper electrode by a user's adjustment.

18. A method of controlling an automatic impedance adjuster comprising a plurality of channels having a plurality of first input sensors and a pulse width correction channel having a second input sensor, the method comprising:
  a signal generating step of generating a pulse signal having a pre-determined pulse width;
  a signal processing step of using the plurality of channels and the pulse width correction channel receiving the pulse signal and not outputting the pulse signal when a touch object is in contact with the first or second input sensor to determine that the touch object is in contact with the first or second input sensor, and outputting the pulse signal when the touch object is not in contact with the first or second input sensor to determine that the touch object is not in contact with the first or second input sensor, the pulse width correction channel initiating an automatic impedance adjustment mode when the pulse signal is not detected therefrom;
  a control and output step of receiving the pulse signal to output whether the touch object is in contact with a channel, and entering the automatic impedance adjustment mode to control a pulse width control signal to vary the pre-determined pulse width of the pulse signal when the pulse signal is not detected through all the plurality of channels or the pulse width correction channel; and
  an automatic impedance adjustment step of performing the automatic impedance adjustment mode.

19. The method according to claim 18, wherein the signal processing step comprises:
  a phase delay step of receiving the pulse signal, and delaying a phase of the pulse signal when the touch object is in contact with the input sensor and not delaying the phase of the pulse signal when the touch object is not in contact with the input sensor; and
  a pulse signal classification step of receiving the pulse signal of the phase delay step, and not outputting the pulse signal when the phase of the pulse signal is delayed and outputting the pulse signal when the phase of the pulse signal is not delayed.

20. The method according to claim 18, wherein the control and output step comprises:
  a first correction entering step of receiving the pulse signal and determining whether a pulse signal of the pulse width correction channel is transmitted, determining whether the touch object is in contact with the second input sensor of the pulse width correction channel when the pulse signal is not transmitted, and entering the automatic impedance adjustment mode for correcting the pulse width of all the plurality of channels and the pulse width correction channel; and
  a channel contact determination and signal output step of determining whether the pulse signals of all the plurality of channels except the pulse width correction channel are transmitted and entering the automatic impedance adjustment mode when the pulse signals of all the plurality of channels except the pulse width correction channel are transmitted, and determining that the touch object is in contact with some of the plurality of channels to output a contact with some of the plurality of channels when the pulse signal is transmitted to some of the plurality of channels.

21. The method according to claim 20, wherein the channel contact determination and signal output step comprises:
  a first channel contact determination step of determining whether the pulse signals of all the plurality of channels except the pulse width correction channel are transmitted when the pulse signals are transmitted to the pulse width correction channel of the first correction entering step;
  an impedance adjustment determination step of determining whether an impedance adjustment operation period has arrived when the pulse signals of all the plurality of channels except the pulse width correction channel are transmitted, and entering the automatic impedance adjustment mode or increasing a non-contact time to check the impedance adjustment operation period; and a second channel contact and signal output step of determining whether the pulse signals of some of the plurality of channels are transmitted when the pulse signals of all the plurality of channels except the pulse width correction channel are not transmitted, and entering the automatic impedance adjustment mode or outputting a channel contact to an exterior.

22. The method according to claim 21, wherein the impedance adjustment determination step comprises:

a correction period determination step of determining that touch pads of all the plurality of channels are not in contact with the touch object when the pulse signals of all the plurality of channels except the pulse width correction channel are transmitted during the first channel contact determination step, and determining whether the impedance adjustment operation period has arrived;

a second correction entering step of entering the automatic impedance adjustment mode for correcting the pulse widths of all the plurality of channels when the impedance adjustment operation period of the correction period determination step has arrived;

a non-contact time increasing step of increasing the non-contact time by a preset time and entering the signal generating step when the impedance adjustment operation period of the correction period determination step has not arrived; and a first non-contact time reset step of resetting the non-contact time and entering the signal generating step after performing the second correction entering step.

23. The method according to claim 21, wherein the second channel contact and signal output step comprises:

a partial channel contact determination step of determining whether the pulse signals of all the plurality of channels except the pulse width correction channel are not transmitted when the pulse signals of all the plurality of channels except the pulse width correction channel are not transmitted;

a third correction entering step of determining that all the plurality of channels except the pulse width correction channel are in contact with the touch object when the pulse signals of all the plurality of channels except the pulse width correction channel of the partial channel contact determination step are not transmitted, and entering the automatic impedance adjustment mode for correcting the pulse widths of all the plurality of channels;

a contact or non-contact output step of determining that the first input sensors of some of the plurality of channels are in contact with the touch object when only the pulse signals of some of the plurality of channels except the pulse width correction channel of the partial channel contact determination step are not transmitted, and outputting whether the plurality of channels are in contact with the touch object; and a second non-contact time reset step of resetting the non-contact time and entering the signal generating step after performing the contact or non-contact output step.

24. The method according to claim 23, wherein the contact or non-contact output step further comprises:

an output channel checking step of determining whether the previous contacted channel is identical to the current contacted channel, resetting a same channel contact time when the previous contacted channel is different from the current contacted channel and entering the second non-contact time reset step, and increasing the same channel contact time by a preset time when the previous contacted channel is identical to the current contacted channel; and the same channel correction step of determining whether the same channel contact time is larger than or equal to a pre-determined value of a same channel impedance adjustment time after increasing the same channel contact time by the preset time, entering the second non-contact time reset step when the same channel contact time is smaller than the same channel impedance adjustment time, entering the automatic impedance adjustment mode when the same channel contact time is larger than or equal to the same channel impedance adjustment time, and resetting the same channel contact time.

25. The method according to claim 23, wherein the contact or non-contact output step further comprises:

an output channel checking step of determining whether the previously contacted channel is identical to the currently contacted channel, resetting a same channel contact time when the previously contacted channel is different from the currently contacted channel and entering the second non-contact time reset step, and increasing the same channel contact time by a preset time when the previously contacted channel is identical to the currently contacted channel; and the same channel correction step of determining whether the same channel contact time is larger than or equal to the same channel impedance adjustment time after increasing the same channel contact time by the preset time, entering the second non-contact time reset step when the same channel contact time is smaller than the same channel impedance adjustment time, setting the non-contact determination time to be small in order to reduce a time to enter the automatic impedance adjustment mode when the same channel contact time is larger than or equal to the same channel impedance adjustment time, and resetting the same channel contact time.

26. A method of controlling an automatic impedance adjuster comprising a plurality of channels having a plurality of first input sensors and a reference pulse channel having a second input sensor, the method comprising:

a signal generating step of generating a pulse signal having a predetermined pulse width;

a signal processing step of using the plurality of channels and the reference pulse channel receiving the pulse signal and outputting a phase-varied pulse signal when a touch object is in contact with the first or second input sensor to determine that the touch object is in contact with the first or second input sensor, and outputting a non-phase-varied pulse signal when the touch object is not in contact with the first or second input sensor to determine that the touch object is not in contact with the first or second input sensor, the reference pulse channel initiating an automatic impedance adjustment mode when the phase-varied pulse signal is not detected therefrom;

a control and output step of receiving either the phase-varied pulse signal or the non-phase-varied pulse signal to output whether the touch object is in contact with a channel, and entering the automatic impedance adjustment mode to control a delay value control signal to delay the pulse signal when the phase-varied pulse signal is detected through all the plurality of channels or the reference pulse channel; and an automatic impedance adjustment step of performing the automatic impedance adjustment mode.

27. The method according to claim 26, wherein the signal processing step comprises:
- a reference delay step of receiving the pulse signal and delaying the pulse signal by a certain time to generate a reference delay signal; and
- a phase delay step of receiving the pulse signal to output the phase-varied pulse signal of a pulse signal phase-delayed more than the reference delay signal when a touch object is in contact with the first or second input sensor, and to output the non-phase-varied pulse signal of a pulse signal phase-delayed less than the reference delay signal when the touch object is not in contact with the first or second input sensor.

28. The method according to claim 26, wherein the control and output step comprises:
- a first correction entering step of receiving the pulse signal and determining whether the pulse signal of the reference pulse channel is identical to the previous pulse signal, determining that the touch object is in contact with the second input sensor of the reference pulse channel when the pulse signal of the reference pulse channel is different from the previous pulse signal, and entering the automatic impedance adjustment mode for setting delay values of all the plurality of channels; and
- a channel contact determination and signal output step of determining whether the pulse signals of all the plurality of channels, except the reference pulse channel, are identical to the previous pulse signal when the pulse signal of the reference pulse channel is identical to the previous pulse signal and entering the automatic impedance adjustment mode, and determining that the touch object is in contact with the first input sensors of some of the plurality of channels when the pulse signals of some of the plurality of channels are not identical to the previous pulse signal and outputting whether the touch object is in contact with channel.

29. The method according to claim 28, wherein the channel contact determination and signal output step comprises:
- a first channel contact determination step of determining whether the pulse signals of all the plurality of channels, except the reference pulse channel, are identical to the previous pulse signals when the pulse signal of the reference pulse channel is identical to the previous pulse signal of the reference pulse channel during the first correction entering step;
- an impedance adjustment determination step of determining whether the impedance adjustment operation period has arrived when the pulse signals of all the plurality of channels, except the reference pulse channel, are identical to the previous pulse signals and entering the automatic impedance adjustment mode or increasing a non-contact time to check the impedance adjustment operation period; and
- a second channel contact and signal output step of determining that the pulse signals of some of the plurality of channels are different from the previous pulse signals when the pulse signals of all the plurality of channels, except the reference pulse channel, are different from the previous pulse signals, and entering the automatic impedance adjustment mode or outputting whether the touch object is in contact with the channel to the exterior.

30. The method according to claim 29, wherein the impedance adjustment determination step comprises:
- a correction period determination step of determining that the first input sensors of all the plurality of channels are not in contact with the touch object when the pulse signals of all the plurality of channels except the reference pulse channel are the same as the previous pulse signals during the first channel contact determination step, and determining whether the impedance adjustment operation period has arrived;
- a second correction entering step of entering the automatic impedance adjustment mode for setting the delay values of all the plurality of channels when the impedance adjustment operation of the correction period determination step has arrived;
- a non-contact time increasing step of increasing the non-contact time by a preset time when the impedance adjustment operation of the correction period determination step has not arrived, and entering the signal generating step; and
- a first non-contact time reset step of resetting the non-contact time after performing the second correction entering step, and entering the signal generating step.

31. The method according to claim 29, wherein the second channel contact and signal output step comprises:
- a partial channel contact determination step of determining whether the pulse signals of all the plurality of channels except the reference pulse channel are different from the previous pulse signals when the pulse signals of all the plurality of channels except the reference pulse channel are different from the previous pulse signals;
- a third correction entering step of determining that the first input sensors of all the plurality of channels except the reference pulse channel are in contact with the touch object when the pulse signals of all the plurality of channels except the reference pulse channel of the partial channel contact determination step are different from the previous pulse signals, and entering the automatic impedance adjustment mode for setting the delay values of all the plurality of channels;
- a contact or non-contact output step of determining that the first input sensors of some of the plurality of channels are in contact with the touch object when the pulse signals of some of the plurality of channels, except the reference pulse channel, of the partial channel contact determination step are different from the previous pulse signal, and outputting whether the contact channel is in contact with the touch object to the exterior; and
- a second non-contact time reset step of resetting the non-contact time after performing the contact or non-contact output step, and entering the signal generating step.

32. The method according to claim 31, wherein the contact or non-contact output step further comprises:
- an output channel checking step of determining whether a currently contacted channel is identical to the previous contacted channel, resetting a same channel contact time when the previously contacted channel is different from the currently contacted channel and entering the second non-contact time reset step, and increasing the same channel contact time by a preset time when the previously contacted channel is identical to the currently contacted channel; and
- a same channel correction step of determining whether the same channel contact time is larger than or equal to a pre-determined value of a same channel impedance adjustment time after increasing the same channel contact time by a preset time, entering the second non-contact time reset step when the same channel contact time is smaller than the same channel impedance adjustment time, entering the automatic impedance adjustment mode when the same channel contact time is larger than or equal to the same channel impedance adjustment time, and resetting the same channel contact time.

33. The method according to claim 31, wherein the contact or non-contact output step further comprises:
- an output channel checking step of determining whether the previously contacted channel is identical to the currently contacted channel, resetting the same channel contact time when the previously contacted channel is different from the currently contacted channel and entering the second non-contact time reset step, and increasing the same channel contact time by a preset time when the previously contacted channel is identical to the currently contacted channel; and
- a correction time setting step of determining whether the same channel contact time is larger than or equal to the same channel impedance adjustment time after increasing the same channel contact time by the preset time, entering the second non-contact time reset step when the same channel contact time is smaller than the same channel impedance adjustment time, setting the non-contact time to be small in order to reduce a time to enter the automatic impedance adjustment mode when the same channel contact time is larger than or equal to the same channel impedance adjustment time, and resetting the same channel contact time.

* * * * *